(12) United States Patent
Lauer

(10) Patent No.: US 11,526,796 B2
(45) Date of Patent: Dec. 13, 2022

(54) QUBIT PULSE CALIBRATION VIA CANARY PARAMETER MONITORING

(71) Applicant: International Business Machines Corporation, Armonk, NY (US)

(72) Inventor: Isaac Lauer, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 314 days.

(21) Appl. No.: 16/929,922

(22) Filed: Jul. 15, 2020

(65) Prior Publication Data
US 2022/0019927 A1    Jan. 20, 2022

(51) Int. Cl.
*G06N 10/00*    (2022.01)
*G06N 10/20*    (2022.01)
(Continued)

(52) U.S. Cl.
CPC .............. *G06N 10/00* (2019.01); *B82Y 10/00* (2013.01); *G06F 11/3024* (2013.01);
(Continued)

(58) Field of Classification Search
CPC ........ G06N 10/00; G06N 10/20; G06N 20/10; G06N 10/40; B82Y 10/00; G06F 11/3024; G06F 11/3495; H03K 19/195
See application file for complete search history.

(56) References Cited

U.S. PATENT DOCUMENTS 9,940,212 B2    4/2018    Kelly
10,063,228 B2    8/2018    Deurloo et al.
(Continued)

FOREIGN PATENT DOCUMENTS

WO    2020055450    2/2019

OTHER PUBLICATIONS

Amazon CloudWatch. User Guide. (No. Date).*
(Continued)

*Primary Examiner* — Vibol Tan
(74) *Attorney, Agent, or Firm* — Amin, Turocy & Watson, LLP

(57) ABSTRACT

Systems and techniques that facilitate qubit pulse calibration via canary parameter monitoring are provided. In various embodiments, a system can comprise a measurement component that can measure a canary parameter associated with a qubit control channel. In various embodiments, the system can further comprise a scaling component that can modify a plurality of parameters associated with the qubit control channel via a scaling factor. In various cases, the scaling factor can be based on the canary parameter. In various embodiments, the canary parameter can be a rotation error of a qubit driven by a microwave pulse transmitted along the qubit control channel. In various embodiments, the plurality of parameters can be amplitudes of a plurality of microwave pulses transmitted along the qubit control channel. In various embodiments, the plurality of parameters can be phases of a plurality of microwave pulses transmitted along the qubit control channel.

20 Claims, 12 Drawing Sheets
(1 of 12 Drawing Sheet(s) Filed in Color)

(51) Int. Cl.
*G06F 11/34* (2006.01)
*G06F 11/30* (2006.01)
*B82Y 10/00* (2011.01)
*H03K 19/195* (2006.01)

(52) U.S. Cl.
CPC ......... *G06F 11/3495* (2013.01); *G06N 10/20* (2022.01); *H03K 19/195* (2013.01)

(56) References Cited

U.S. PATENT DOCUMENTS

| | | | | |
|---|---|---|---|---|
| 10,152,988 | B2 * | 12/2018 | Kim | G06N 20/10 |
| 10,282,675 | B2 * | 5/2019 | Bloom | G06N 10/00 |
| 10,311,980 | B2 * | 6/2019 | Kim | G06N 7/005 |
| 10,483,980 | B2 | 11/2019 | Sete et al. | |
| 10,546,244 | B2 * | 1/2020 | Bishop | H04B 3/32 |
| 10,643,143 | B2 * | 5/2020 | Bloom | H03K 19/195 |
| 10,896,765 | B2 * | 1/2021 | Kim | G06N 20/10 |
| 10,915,831 | B2 * | 2/2021 | Bishop | H04B 3/32 |
| 11,164,103 | B2 * | 11/2021 | Bloom | G06N 10/00 |
| 11,348,694 | B2 * | 5/2022 | Kim | G06N 20/10 |
| 2014/0229722 | A1 | 8/2014 | Harris | |
| 2018/0060568 | A1 * | 3/2018 | Galenson | G06F 21/54 |
| 2019/0392341 | A1 | 12/2019 | Leipold et al. | |
| 2020/0050958 | A1 | 2/2020 | Bloom et al. | |
| 2021/0406757 | A1 * | 12/2021 | Kim | G06N 10/40 |

OTHER PUBLICATIONS

Detecting Qubit-coupling Faults in Ion-trap Quantum Computers. Andrii Maksymov et al. (Year: 2022).*

Bulk and surface loss in superconducting transmon qubits. Oliver Dial et al. (Year: 2016).*

High-Speed Calibration and Characterization of Superconducting Quantum Processors without Qubit Reset. M. Werninghaus et al. (Year: 2021).*

Mell et al., "The NIST Definition of Cloud Computing," Recommendations of the National Institute of Standards and Technology, NIST Special Publication 800-145, Sep. 2011, 7 pages.

Balasiu, "Single-Qubit Gates Calibration in PycQED using Superconducting Qubits," Semester Thesis for Swiss Federal Institute of Technology Zurich, Aug. 17, 2017, 60 pages.

* cited by examiner

QUBIT PULSE CALIBRATION VIA CANARY PARAMETER MONITORING

BACKGROUND

The subject disclosure relates to monitoring of qubits, and more specifically to qubit pulse calibration via canary parameter monitoring.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate qubit pulse calibration via canary parameter monitoring are described.

According to one or more embodiments, a system is provided. The system can comprise a memory that can store computer-executable components. The system can further comprise a processor that can be operably coupled to the memory and that can execute the computer-executable components stored in the memory. In various embodiments, the computer-executable components can comprise a measurement component that can measure a canary parameter associated with a qubit control channel. In various embodiments, the computer-executable components can further comprise a scaling component that can modify a plurality of parameters associated with the qubit control channel via a scaling factor. In various cases, the scaling factor can be based on the canary parameter. In various embodiments, the canary parameter can be a rotation error of a qubit driven by a microwave pulse transmitted along the qubit control channel. In various embodiments, the plurality of parameters can be amplitudes of a plurality of microwave pulses transmitted along the qubit control channel. In various embodiments, the plurality of parameters can be phases of a plurality of microwave pulses transmitted along the qubit control channel.

According to one or more embodiments, the above-described system can be implemented as a computer-implemented method and/or computer program product.

DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION

Figure 1:
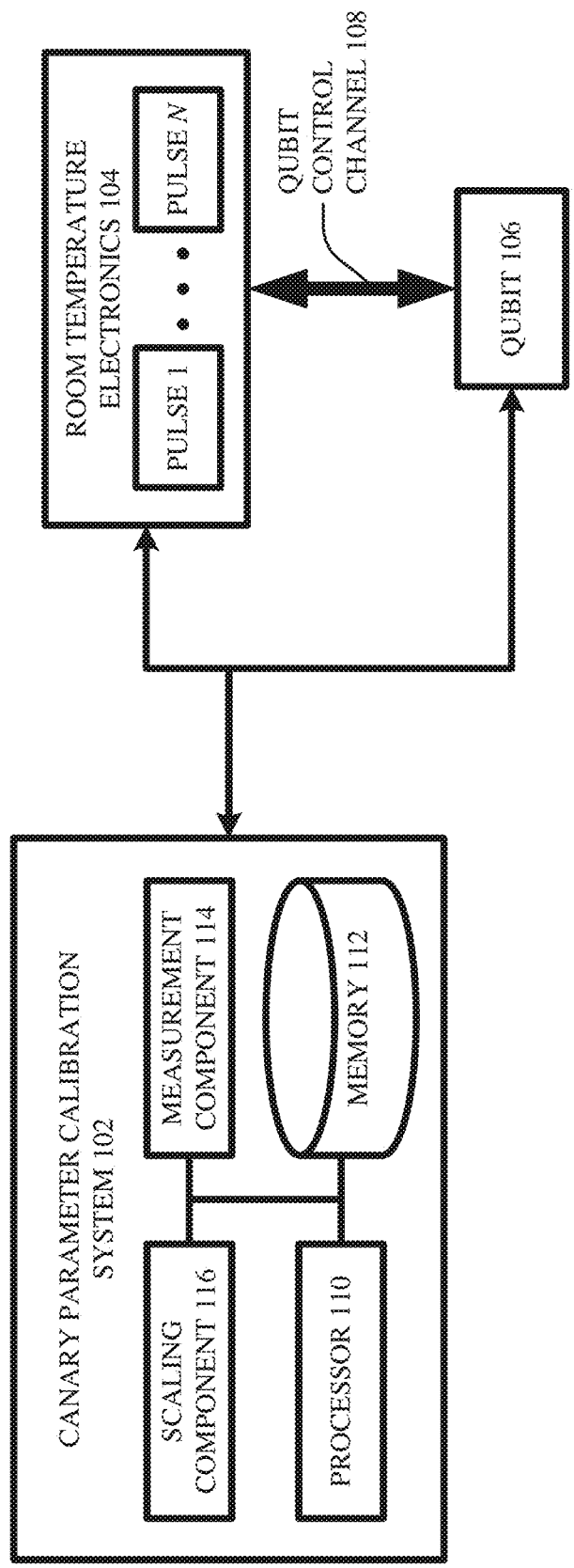
FIG. 1 illustrates a block diagram of an example, non-limiting system that facilitates qubit pulse calibration via canary parameter monitoring in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

In modern quantum computing systems, superconducting qubits can be controlled and/or driven by microwave pulses and/or microwave signals. In various aspects, a particular microwave pulse/signal can correspond to a particular quantum gate, such that exposing a superconducting qubit to the particular microwave pulse/signal can cause the particular quantum gate to be applied to the qubit. In other words, the qubit can undergo a particular state rotation that corresponds to the particular quantum gate when the qubit is driven by the particular microwave pulse/signal (e.g., when the qubit is driven by a pulse/signal having a particular amplitude, a particular frequency, and/or a particular phase). In still other words, quantum gate operations can be performed on a superconducting qubit by driving and/or feeding the superconducting qubit with corresponding microwave pulses/signals. In various cases, a single-qubit gate can be applied to a superconducting qubit by driving the superconducting qubit with a microwave pulse/signal at the transition frequency of the superconducting qubit. In various cases, a cross-resonance gate (e.g., which can entangle a control qubit and a target qubit) can be applied to a superconducting qubit by driving the superconducting qubit with a microwave pulse/signal at the transition frequency of the target qubit.

In order to facilitate driving a superconducting qubit with such microwave pulses/signals, a quantum computing system can include room temperature electronics (RTEs) that are physically and/or electrically coupled to the superconducting qubit via a control channel. In various aspects, the room temperature electronics can include any suitable devices for creating, generating, shifting, modulating, and/or controlling microwave pulses/signals, such as waveform generators, local oscillators, and/or frequency synthesizers. In various instances, the control channel can include any suitable devices for transmitting microwave pulses/signals from the room temperature electronics to the superconducting qubit, such as coaxial cables, mixers, and/or amplifiers. In various cases, the room temperature electronics can generate the microwave pulses/signals, and the microwave pulses/signals can propagate along the control channel to the superconducting qubit. In various cases, the room temperature electronics can generate different microwave pulses/signals at different times, and such different microwave pulses/signals can travel along the control channel to the superconducting qubit at those different times, thereby causing different state rotations of the superconducting qubit at those different times. For instance, the room temperature electronics can generate a first microwave pulse/signal which can be transmitted to the superconducting qubit via the control channel at a first time, thereby causing a first state rotation of the qubit at the first time. Subsequently, the room temperature electronics can generate a second microwave pulse/signal which can be transmitted to the superconducting qubit via the control channel at a second time, thereby causing a second state rotation of the qubit at the second time. And so on. In other words, the superconducting qubit can be coupled to the set of room temperature electronics by a single control channel, and different microwave pulses/signals can propagate at different times from the set of room temperature electronics, along the single control channel, and to the superconducting qubit.

In some cases, a quantum computing system can have multiple qubits, with each qubit having its own dedicated control channel and/or its own dedicated set of room temperature electronics. In some instances where multiple qubits are implemented, each qubit can have its own dedicated control channel, but the multiple qubits can share a set of room temperature electronics (e.g., such that the set of room temperature electronics can generate microwave pulses/signals to drive the multiple qubits). For ease of explanation, however, the herein description mainly describes non-limiting scenarios involving one superconducting qubit and one set of room temperature electronics corresponding to the one superconducting qubit.

In various instances, although ambient conditions of the superconducting qubit can be well controlled and/or can be static (e.g., the superconducting qubit can be kept at very low temperatures inside of a cryostat), ambient conditions of the room temperature electronics can be less well controlled and/or can be dynamic (e.g., the ambient temperatures of the room temperature electronics can experience variations and/or fluctuations over time). Such variations and/or fluctuations in the ambient conditions of the room temperature electronics can negatively interfere with operation of the quantum computing system. Specifically, when the ambient conditions (e.g., temperature) of the room temperature electronics vary and/or fluctuate, the power levels and/or power outputs of the room temperature electronics can commensurately vary and/or fluctuate. When the power levels and/or power outputs of the room temperature electronics vary and/or fluctuate, the amplitudes and/or phases of the microwave pulses/signals generated by the room temperature electronics can correspondingly vary and/or fluctuate. When the amplitudes and/or phases of the microwave pulses/signals vary and/or fluctuate, the quantum gates being applied to the superconducting qubit by the microwave pulses/signals can likewise vary and/or fluctuate. When the quantum gates being applied to the superconducting qubit by the microwave pulses/signals vary and/or fluctuate, the state rotations that are induced in the superconducting qubit can commensurately vary and/or fluctuate. Thus, the result of ambient condition variations and/or fluctuations can be that incomplete, improper, and/or undesired state rotations are being applied to the superconducting qubit (e.g., an operator of the quantum computing system may believe that a qubit is being driven by a microwave pulse/signal corresponding to an X-gate, but due to an increase and/or decrease in ambient temperature of the room temperature electronics, the qubit can actually be driven by a microwave pulse/signal that has too much and/or too little power to facilitate an X-gate operation, with the result being that the qubit is undergoing a state rotation that does not correspond to an X-gate operation). This can lead to a situation where the performance of the quantum computing system tracks ambient temperature of the quantum computing system (e.g., performance of the room temperature electronics can be a function of the ambient temperature).

To facilitate proper operation of the quantum computing system, the microwave pulses/signals generated by the room temperature electronics can be monitored and/or calibrated (e.g., the amplitudes and/or phases of the microwave pulses/signals can be periodically sensed and adjusted to ensure that the desired quantum gates are being applied to the superconducting qubit at the desired times). In various aspects, such calibration can be implemented in two stages: a first coarse calibration and a second fine calibration. In various aspects, the coarse calibrations can get roughly the correct pulse parameters (e.g., can set the amplitudes and/or phases of the different microwave pulses/signals to roughly the desired values) and the fine calibration can get low error (e.g., can get the amplitudes and/or phases of the different microwave pulses/signals to within a suitable measurement resolution of desired values). Due to fluctuations in the superconducting qubit itself as well as fluctuations in the performance of the room temperature electronics, it can be necessary to periodically recalibrate all the microwave pulses/signals in this fashion to maintain desired performance of the quantum computing system.

In various instances, for each qubit in a quantum computing system, such periodic calibrations can be performed on all the different microwave pulses/signals that can be fed to the qubit (e.g., can be performed on all the different microwave pulses/signals that can be generated by the room temperature electronics that drive the qubit). In various cases, this can be incredibly time-consuming (e.g., a quantum computing system can include tens or hundreds or thousands of qubits, and each qubit can potentially be driven by any number of different microwave pulses/signals at different times). Moreover, during calibration of such microwave pulses/signals, the quantum computing system can be unable to perform quantum computations for clients (e.g., calibration can require that the qubits be driven by test pulses/signals, which means that the qubits are not available for runtime computations since the qubits cannot be simultaneously driven by runtime pulses/signals). Because such full-scale calibrations can be very time-consuming, they can result in extensive downtime for the quantum computing system (e.g., extensive amounts of time during which the quantum computing system is not able to perform computations for clients). In various aspects, systems and/or techniques that can address one or more of these technical problems can be desirable.

Various embodiments of the invention can address one or more of these technical problems. Specifically, various embodiments of the invention can provide systems and/or techniques that can facilitate efficient calibration of the different microwave pulses/signals that can be fed to a superconducting qubit in a quantum computing system, without being unnecessarily time-consuming and without requiring long durations of downtime for the quantum computing system.

The inventor of various embodiments of the invention recognized that, in various cases, the primary mechanism that causes variations and/or fluctuations in the different microwave pulses/signals that can be fed to a superconducting qubit is variations and/or fluctuations in the ambient temperature of the room temperature electronics that can generate those different microwave pulses/signals. As mentioned above, when the ambient temperature increases and/or decreases, the power output of the room temperature electronics can correspondingly increase and/or decrease, which can cause corresponding increases and/or decreases in the power level (e.g., amplitudes and/or phases) of the different microwave pulses/signals that can be generated by the room temperature electronics, which can in turn cause corresponding changes in the quantum gates that can be applied to the superconducting qubit. Because the performance of the room temperature electronics can be influenced by the ambient temperature, and because the different microwave pulses/signals that can be fed to the superconducting qubit can be generated by the room temperature electronics, the different microwave pulses/signals can, in various instances, all be affected in similar ways by the ambient temperature. That is, in various aspects, when the ambient temperature of the room temperature electronics increases and/or decreases, the power levels (e.g., amplitudes and/or phases) of all the different microwave pulses/signals that can be generated by the room temperature electronics can all increase and/or decrease by the same and/or similar proportion, percentage, and/or ratio (e.g., if the ambient temperature changes so that the power level of one of the microwave pulses/signals generated by the room temperature electronics is 15% greater than it should be, it can be inferred and/or assumed that the power levels of all the different microwave pulses/signals that can be generated by the room temperature electronics are also 15% greater than they should be). Because the power levels of all the different microwave pulses/signals that can be generated by the room temperature electronics can all be affected in similar ways by the ambient temperature of the room temperature electronics, it can be possible, in various cases, to calibrate all the different microwave pulses/signals that can be generated by the room temperature electronics by monitoring only a single microwave pulse/signal (e.g., by monitoring only a single pulse/signal per qubit) rather than by monitoring each of the different microwave pulses/signals independently. Specifically, that single microwave pulse/signal can be monitored to determine a proportion and/or percentage of power deviation caused by ambient conditions of the room temperature electronics, and the entire plurality of microwave pulses/signals that can be fed to the superconducting qubit can be assumed and/or inferred to suffer from the same proportion and/or percentage of power deviation. Thus, the entire plurality of microwave pulses/signals (e.g., corresponding to one superconducting qubit) can be calibrated/adjusted in one swoop to correct that common power deviation, without having to independently monitor and/or test each microwave pulse/signal individually.

In various aspects, the one microwave pulse/signal that is monitored (and/or a measurable indication of the power level of that one microwave pulse/signal) can be considered as a canary parameter that captures the variability of all the other microwave pulses/signals that can be generated by the room temperature electronics. In other words, the one microwave pulse/signal that is monitored (and/or a measurable indication of the power level of that one microwave pulse/signal) can be considered as a proxy that represents not only its own behavior in response to ambient temperature, but also the behaviors in response to ambient temperature of all the other microwave pulses/signals that can be generated by the room temperature electronics corresponding to the superconducting qubit in question.

Various embodiments described herein include systems, computer-implemented methods, apparatus, and/or computer program products that can facilitate qubit pulse calibration via canary parameter monitoring. In various embodiments, a system can comprise a measurement component and a scaling component. In various aspects, the measurement component can measure a canary parameter associated with a control channel coupled to a qubit. In various cases, the canary parameter can be the power level of one microwave pulse/signal that can be transmitted along the control channel and fed to the qubit. In some cases, the power level of the one microwave pulse/signal can be derived from a rotation error of the qubit when the qubit is driven by the one microwave pulse/signal (e.g., the rotation error can represent a difference between the actual/measured state rotation of the qubit when the qubit is driven by the one microwave pulse/signal and a desired, intended, and/or goal state rotation of the qubit that is supposed to occur when the qubit is driven by the one microwave pulse/signal). In various instances, the scaling component can generate a scaling factor based on the canary parameter. In various cases, the scaling factor can be a ratio that represents a percentage and/or proportion by which the power level of the one microwave pulse/signal should be increased and/or decreased in order to achieve a desired power level (e.g., where the desired power level would cause the desired, intended, and/or goal state rotation in the qubit). In various cases, the scaling component can modify a plurality of parameters associated with the control channel via the scaling parameter. In various aspects, the plurality of parameters associated with the control channel can be the power levels of a plurality of microwave pulses/signals that can be transmitted along the control channel and fed to the qubit. Thus, in various cases, the one microwave pulse/signal can be monitored in order to generate the scaling factor, and then all of the plurality of microwave pulses/signals that can be fed to the qubit can be corrected, calibrated, and/or modified by the scaling factor. Because the primary external influence on the power levels of the plurality of microwave pulses/signals is ambient temperature, the ambient temperature can be assumed and/or inferred to similarly affect (e.g., by the same/similar proportions and/or percentages) all of the plurality of microwave pulses/signals.

To help clarify various aspects of the above discussion, consider the following illustrative, non-limiting example. Suppose that a superconducting qubit is coupled to a control channel, which is coupled to a collection of room temperature electronics. Suppose that the collection of room temperature electronics can generate four different microwave pulses/signals: a first microwave pulse/signal that can correspond to an X-gate, a second microwave pulse/signal that can correspond to a Y-gate, a third microwave pulse/signal that can correspond to an X90 gate, and a fourth microwave pulse/signal that can correspond to a cross-resonance gate. In various aspects, the first microwave pulse/signal can, in normal operating conditions, have a power level $W_1$, an amplitude $A_1$, and/or a phase $P_1$ that correspond to an X-gate, can have a frequency that matches the transition frequency of the superconducting qubit (e.g., an X-gate is a single-qubit quantum gate), and can thus cause the superconducting qubit to undergo a state rotation that corresponds to an X-gate operation. In various aspects, the second microwave pulse/signal can, in normal operating conditions, have a power level $W_2$, an amplitude $A_2$, and/or a phase $P_2$ that correspond to a Y-gate, can have a frequency that matches the transition frequency of the superconducting qubit (e.g., a Y-gate is a single-qubit quantum gate), and can thus cause the superconducting qubit to undergo a state rotation that corresponds to a Y-gate operation. In various aspects, the third microwave pulse/signal can, in normal operating conditions, have a power level $W_3$, an amplitude $A_3$, and/or a phase $P_3$ that correspond to an X90-gate, can have a frequency that matches the transition frequency of the superconducting qubit (e.g., an X90-gate is a single-qubit quantum gate), and can thus cause the superconducting qubit to undergo a state rotation that corresponds to an X90-gate operation. Lastly, in various aspects, the fourth microwave pulse/signal can, in normal operating conditions, have a power level $W_4$, an amplitude $A_4$, and/or a phase $P_4$ that correspond to a cross-resonance gate, can have a frequency that matches the transition frequency of a target qubit coupled to the superconducting qubit (e.g., a cross-resonance gate is a multi-qubit quantum gate), and can thus cause the superconducting qubit to undergo a state rotation that corresponds to a cross-resonance gate operation (e.g., entangling with the target qubit).

In various aspects, suppose that the collection of room temperature electronics is exposed to a decrease in ambient temperature (e.g., such that the actual ambient temperature is below the normal operating temperature of the collection of room temperature electronics). Such decrease in ambient temperature can affect the characteristics (e.g., power, which can correspond to amplitude and/or phase) of the first, second, third, and/or fourth microwave pulses/signals that can be generated by the collection of room temperature electronics. For instance, under normal operating conditions, the collection of room temperature electronics can generate the first microwave pulse/signal such that it has a power level of $W_1$, an amplitude of $A_1$, and/or a phase of $P_1$. However, when exposed to the decreased ambient temperature, the program settings of the collection of room temperature electronics can cause the collection of room temperature electronics to generate the first microwave pulse/signal to instead have a power level of $W_1^* \neq W_1$, an amplitude of $A_1^* \neq A_1$, and/or a phase of $P_1^* \neq P_1$. In other words, the decreased ambient temperature can affect the power, amplitude, and/or phase of the first microwave pulse/signal that can be generated by the collection of room temperature electronics, such that the first microwave pulse/signal no longer corresponds to an X-gate operation. Similarly, under normal operating conditions, the collection of room temperature electronics can generate the second microwave pulse/signal such that it has a power level $W_2$, an amplitude of $A_2$, and/or a phase of $P_2$. However, when exposed to the decreased ambient temperature, the program settings of the collection of room temperature electronics can cause the collection of room temperature electronics to generate the second microwave pulse/signal to instead have a power level of $W_2^* \neq W_2$, an amplitude of $A_2^* \neq A_2$, and/or a phase of $P_2^* \neq P_2$. In other words, the decreased ambient temperature can affect the power, amplitude, and/or phase of the second microwave pulse/signal that can be generated by the collection of room temperature electronics, such that the second microwave pulse/signal no longer corresponds to a Y-gate operation. Likewise, under normal operating conditions, the collection of room temperature electronics can generate the third microwave pulse/signal such that it has a power level of $W_3$, an amplitude of $A_3$, and/or a phase of $P_3$. However, when exposed to the decreased ambient temperature, the program settings of the collection of room temperature electronics can cause the collection of room temperature electronics to generate the third microwave pulse/signal to instead have a power level of $W_3^* \neq W_3$, an amplitude of $A_3^* \neq A_3$, and/or a phase of $P_3^* \neq P_3$. In other words, the decreased ambient temperature can affect the power, amplitude, and/or phase of the third microwave pulse/signal that can be generated by the collection of room temperature electronics, such that the third microwave pulse/signal no longer corresponds to an X90-gate operation. Lastly, under normal operating conditions, the collection of room temperature electronics can generate the fourth microwave pulse/signal such that it has a power level of $W_4$, an amplitude of $A_4$, and/or a phase of $P_4$. However, when exposed to the decreased ambient temperature, the program settings of the collection of room temperature electronics can cause the collection of room temperature electronics to generate the fourth microwave pulse/signal to instead have a power level of $W_4^* \neq W_4$, an amplitude of $A_4^* \neq A_4$, and/or a phase of $P_4^* \neq P_4$. In other words, the decreased ambient temperature can affect the power, amplitude, and/or phase of the fourth microwave pulse/signal that can be generated by the collection of room temperature electronics, such that the fourth microwave pulse/signal no longer corresponds to a cross-resonance gate operation.

Various embodiments of the invention can correct these deviations due to the decreased ambient temperature. Specifically, in various instances, the superconducting qubit can be driven by the first microwave pulse/signal while the room temperature electronics are exposed to the decreased ambient temperature. In various cases, since the room temperature electronics are exposed to the decreased ambient temperature, the first microwave pulse/signal can cause the superconducting qubit to undergo a state rotation that is not equivalent to an X-gate operation (e.g., as explained above, the power, amplitude, and/or phase of the first microwave pulse/signal can be changed and/or impacted due to the decreased ambient temperature, meaning that the first microwave pulse/signal no longer corresponds to an X-gate operation). In various aspects, the measurement component can measure a rotation error of the superconducting qubit during and/or after the superconducting qubit is driven by the first microwave pulse/signal. In various instances, the rotation error can be a difference and/or distance between the actual state rotation of the superconducting qubit and the goal state rotation of the superconducting qubit. Since the first microwave pulse/signal is supposed to correspond to an X-gate (e.g., since it can be desired for the first microwave pulse/signal to apply an X-gate to the superconducting qubit), the rotation error can be a difference between the measured/actual state rotation of the superconducting qubit that results from application of the first microwave pulse/signal in the context of the decreased ambient temperature and the goal state rotation of the superconducting qubit that would have occurred if an X-gate had been properly applied to the superconducting qubit (e.g., in various cases, a starting state of the superconducting qubit can be known). Based on this information, the magnitude of a power deviation (e.g., a power increase and/or power reduction) caused by the decreased ambient temperature can be determined. Specifically, since the goal state rotation and the power level required to achieve the goal state rotation can be known, and since the actual state rotation experienced by the superconducting qubit can be measured by the measurement component, the power level required to achieve the actual/measured state rotation can be determined and/or calculated via any suitable mathematical, computational, and/or statistical techniques. In short, the actual power level of the first microwave pulse/signal can be derived and/or estimated based on the value of the rotation error associated with the first microwave pulse/signal.

For instance, suppose that the decreased ambient temperature causes the first microwave pulse/signal to have 25% less power than it should have (e.g., that is, the decreased ambient temperature can cause the first microwave pulse/signal to have a power level of $W_1^*=(¾) W_1$). In such case, the measurement component can measure the difference and/or distance between the measured/actual state rotation and the goal state rotation (e.g., can measure the rotation error), and the measurement component can compare the measured/actual state rotation to the goal state rotation in order to determine, estimate, and/or approximate via any suitable technique the power level required to achieve the measured/actual state rotation. Here, the measurement component can thus determine that the measured/actual state rotation was achieved by a power level of $(¾) W_1$ and that the goal state rotation would have been achieved by a power level of $W_1$, which means that a 25% reduction in power was caused by the decreased ambient temperature. In other words, the measurement component can determine that a power level of $W_1$ is needed to apply an X-gate to the superconducting qubit, the measurement component can detect the measured/actual state rotation of the superconducting qubit, the measurement component can compare the measured/actual state rotation to the goal state rotation that would have occurred if an X-gate were properly applied to the superconducting qubit, and the measurement component can accordingly determine that the first microwave pulse/signal had a power level $W_1^*=(¾) W_1$ (e.g., the measurement component can determine that a power level that is 25% lower than the power level associated with an X-gate operation would achieve the measured/actual state rotation). Overall, the measurement component can determine and/or estimate that the decreased ambient temperature caused the first microwave pulse/signal to have ¾ of its nominal and/or intended power level.

In various embodiments, the scaling component can generate a scaling factor based on the rotation error and/or power deviation measured by the measurement component. In various cases, the scaling factor can be a multiplier that represents a proportion by which the power level of the first microwave pulse/signal should be increased and/or decreased in the context of the decreased ambient temperature in order to achieve the goal state rotation. In other words, the scaling factor can represent a ratio and/or percentage by which the power level of the first microwave pulse/signal should be increased and/or decreased in order for the first microwave pulse/signal to properly apply an X-gate operation to the superconducting qubit in the context of the decreased ambient temperature. In various instances, the scaling factor can be a reciprocal of a power deviation caused by the decreased ambient temperature.

For instance, as mentioned above, the measurement component can determine that decreased ambient temperature caused a power deviation of ¾ in the first microwave pulse/signal (e.g., caused a 25% power reduction). Based on this information, the scaling component can determine that, to overcome the power deviation caused by the decreased ambient temperature, the power level of the first microwave pulse/signal should be increased by a factor of 4/3 (e.g., because $(4/3) W_1^*=(4/3) (¾) W_1=W_1$). In other words, the scaling component can determine that a multiplication factor of 4/3 can counteract the power deviation factor of ¾ (e.g., can counteract the 25% power reduction) that was caused by the decreased ambient temperature. Accordingly, the scaling component can generate a scaling factor of 4/3.

In various embodiments, the scaling component can modify the power levels of all four of the microwave pulses/signals based on the scaling factor. As mentioned above, because all of the first, second, third, and fourth microwave pulses/signals can be generated by the collection of room temperature electronics, all of the first, second, third, and fourth microwave pulses/signals can be similarly affected by the decreased ambient temperature. That is, all of the power levels of the first, second, third, and fourth microwave pulses/signals can experience a 25% reduction from their intended values (e.g., $W_1^*=(¾) W_1$, $W_2^*=(¾) W_2$, $W_3^*=(¾) W_3$, and $W_4^*=(¾) W_4$). In such case, all four of the microwave pulses/signals can be calibrated and/or corrected by the same scaling factor of 4/3. In this way, calibration of all four of the microwave pulses/signals can be achieved by monitoring/measuring only the first microwave pulse/signal, without having to independently monitor/measure the second, third, and/or fourth microwave pulses/signals. This can save significant amounts of time as compared to full recalibration in which every microwave pulse/signal that can possibly be fed to a qubit is independently monitored and calibrated.

In various instances, the power level of a microwave pulse/signal can be a function of the amplitude and/or phase and/or frequency of the microwave pulse/signal. Thus, in various cases, the amplitude and/or phase and/or frequency of a microwave pulse/signal can be controlled and/or modulated in order to correspondingly control and/or modulate the power level of the microwave pulse/signal. In various cases, the frequency of a microwave pulse/signal can be controlled and/or modulated in order to distinguish between single-qubit gates and cross-resonance gates. Thus, in various cases, the amplitude and/or phase of the microwave pulse/signal can be controlled and/or modulated to adjust the power level of the microwave pulse/signal. Those of ordinary skill in the art will appreciate how to increase and/or decrease amplitude and/or phase of a microwave pulse/signal in order to achieve desired increases and/or decreases in the power level of the microwave pulse/signal.

Consider yet another illustrative, non-limiting example. Suppose that a qubit can be fed with one of three different microwave pulses/signals, where the first pulse/signal has a desired power level of 100 micro-Watts (μW), where the second pulse/signal has a desired power level of 200 µW, and where the third pulse/signal has a desired power level of 300 µW (e.g., these power levels are non-limiting, exemplary, not necessarily realistic, and chosen solely for purposes of ease of illustration). Suppose that an increase in ambient temperature causes the power level of the first pulse/signal to be 130 µW rather than 100 µW (e.g., causes a 30% increase in power level). In various aspects, the measurement component can measure the actual state rotation of the qubit that is caused by the first pulse/signal, the measurement component can compare that actual/measured state rotation to a desired/goal state rotation that would be caused if the first pulse/signal had a power level of 100 µW, and the measurement component can accordingly determine that the first pulse/signal actually has a power level of 130 µW (e.g., a power deviation of 13/10 and/or a power increase of 30%). Based on this information, the scaling component can determine that the effect of the increased ambient temperature on the first pulse/signal can be counteracted and/or negated and/or cancelled by multiplying the actual power level of the first pulse/signal by a factor of 10/13 (e.g., by reducing the power level of the first pulse/signal by about 23%). That is, the scaling component can determine that (10/13) 130 µW=(10/13) (13/10) 100 µW=100 µW. Accordingly, the scaling component can generate a scaling factor of 10/13, and the scaling component can modulate and/or control the amplitude and/or phase of the first pulse/signal so that the power level of the first pulse/signal is multiplied by the scaling factor of 10/13. Moreover, it can be inferred and/or assumed that the power levels of the second pulse/signal and the third pulse/signal were similarly affected by the increased ambient temperature (e.g., that the increased ambient temperature caused the power level of the second pulse/signal to rise 30% from 200 µW to 260 µW, and that the increased ambient temperature caused be power level of the third pulse/signal to rise 30% from 300 µW to 390 µW). In various aspects, the scaling component can similarly control and/or modulate the amplitudes and/or phases of the second and third pulses/signals in order to control and/or modulate their power levels by the scaling factor of 10/13. Thus, as shown, all three of the pulses/signals can be accurately and efficiently calibrated without having to independently monitor each of the three pulses/signals individually. Instead, a single pulse/signal (e.g., a canary parameter) can be monitored to generate a scaling factor that corrects for the power deviations caused by ambient conditions, and all of the pulses/signals that can be applied to the qubit can be corrected in one swoop by the scaling factor, thereby saving time and resources.

In some instances, the qubit itself can be considered as a power meter and/or a power sensor. That is, the state rotation actually experienced by the qubit in response to an applied pulse/signal can be measured and compared to a desired/goal state rotation. Since a desired/goal power level can be known to correspond to the desired/goal state rotation, this comparison (e.g., the rotation error) can be used to derive and/or infer the actual power level exhibited by the applied pulse/signal. The scaling factor can then be generated to correct this actual power level. Since ambient conditions are the primary source of power level fluctuations in quantum computing systems, and since ambient conditions can similarly affect all the pulses/signals that can be fed to a qubit, a single scaling factor can be generated by monitoring a single pulse/signal (e.g., a canary parameter), and that single scaling factor be used to correct the power levels of all the pulses/signals that can be fed to the qubit.

Various embodiments of the invention can be employed to use hardware and/or software to solve problems that are highly technical in nature (e.g., to facilitate qubit pulse calibration via canary parameter monitoring), that are not abstract and that cannot be performed as a set of mental acts by a human. Further, some of the processes performed can be performed by a specialized computer (e.g., quantum state rotation measurement devices) for carrying out defined tasks related to qubit pulse calibration via canary parameter monitoring (e.g., measuring a canary parameter associated with a qubit control channel, modifying a plurality of parameters associated with the qubit control channel via a scaling factor based on the canary parameter, generating the scaling factor based on a difference between a measured value of the canary parameter and a threshold value of the canary parameter, iteratively repeating the measuring the canary parameter and the modifying the plurality of parameters until a measured value of the canary parameter is below a predetermined threshold). Such defined tasks are not typically performed manually by humans. Moreover, neither the human mind nor a human with pen and paper can measure the quantum state rotation of a qubit and/or modify parameters (e.g., power levels) associated with a qubit control channel. Instead, various embodiments of the invention are inherently and inextricably tied to computer technology and cannot be implemented outside of a quantum computing environment. In various instances, embodiments of the invention can integrate into a practical application the disclosed teachings regarding qubit pulse calibration via canary parameter monitoring. Indeed, in various embodiments, the disclosed teachings can enhance the functionality of quantum calibration techniques by eliminating the need to independently and/or individually monitor and/or measure each microwave pulse/signal that can be fed to a qubit. Instead, embodiments of the invention can facilitate calibration of all the microwave pulses/signals that can be fed to a qubit by monitoring/measuring merely one of those microwave pulses/signals and by generating a scaling factor based on that one monitored/measured microwave pulse/signal. By applying the scaling factor to all of the microwave pulses/signals that can be fed to the qubit, calibration of all the microwave pulses/signals can be achieved, notwithstanding that only one of the microwave pulses/signals was monitored/measured. Various embodiments of the invention thus can save time as compared to full-recalibration techniques that monitor/measure every microwave pulse/signal individually. Not only do systems and/or techniques that perform qubit pulse calibration clearly constitute a useful and practical application of computers, but systems and/or techniques that can perform qubit pulse calibration in less time clearly constitute a concrete technical improvement in the field of qubit pulse calibration. Furthermore, various embodiments of the invention can control real-world devices based on the disclosed teachings. For example, embodiments of the invention can leverage a real-world quantum state measurement device to measure a real-world rotation error of a real-world superconducting qubit. Moreover, embodiments of the invention can leverage the real-world rotation error to generate a scaling factor that can be used to adjust and/or modulate the real-world power levels of real-world microwave pulses/signals that can be fed to the real-world superconducting qubit. In some cases, embodiments of the invention can modulate and/or control real-world amplitudes and/or real-world phases of the real-world microwave pulses/signals based on the scaling factor, in order to correct for real-world power level fluctuations caused by real-world ambient conditions of the real-world superconducting qubit. Such embodiments thus constitute a concrete and tangible technical improvement in the field of qubit pulse calibration.

FIG. 1 illustrates a block diagram of an example, non-limiting system 100 that can facilitate qubit pulse calibration via canary parameter monitoring in accordance with one or more embodiments described herein. As shown, a set of room temperature electronics 104 (hereafter RTE 104) can be physically and/or electrically coupled to a qubit 106 via a qubit control channel 108. In various embodiments, a canary parameter calibration system 102 can facilitate control pulse calibration of the RTE 104, the qubit 106, and/or the qubit control channel 108, as described herein.

In various instances, the RTE 104 can be capable of generating a plurality of microwave pulses (e.g., pulse 1 to pulse N, for any suitable number N). In various cases, the plurality of microwave pulses 1 to N can drive and/or be fed to the qubit 106 by being transmitted along the qubit control channel 108. In various aspects, the RTE 104 can be a collection of any suitable number and/or any suitable types of devices that can generate the plurality of microwave pulses 1 to N, such as waveform generators, local oscillators, and/or frequency synthesizers. In various cases, the plurality of microwave pulses 1 to N can respectively correspond to a plurality of quantum gates. That is, each of the plurality of microwave pulses 1 to N can have a unique power level (e.g., a unique amplitude and/or a unique phase as controlled and/or modulated by the RTE 104) such that application of the microwave pulse to the qubit 106 can cause a corresponding quantum gate to act on the qubit 106. When a quantum gate acts on the qubit 106, the qubit 106 can experience a state rotation consistent with the quantum gate. In some cases, any of the plurality of microwave pulses 1 to N can be a single-qubit quantum gate (e.g., X-gate, Y-gate, Z-gate, X90-gate, any other suitable single-qubit quantum gate). In some cases, any of the plurality of microwave pulses 1 to N can be a multi-qubit quantum gate (e.g., cross-resonance entangling gate). In various instances, the qubit 106 can be any suitable superconducting qubit (e.g., flux qubit, charge qubit, transmon qubit). In various cases, the qubit 106 can be any suitable type of qubit (e.g., even if not a superconducting qubit) that can be driven by any of the plurality of microwave pulses 1 to N that can be generated by the RTE 104. In various aspects, the qubit control channel 108 can be any suitable device along which any of the plurality of microwave pulses 1 to N can propagate so as to drive and/or feed the qubit 106 (e.g., coaxial cabling, mixers, and/or amplifiers). In some instances, the RTE 104, the qubit control channel 108, and/or the qubit 106 can be located on one or more quantum substrates such as a silicon wafers (not shown).

In some instances, the qubit 106 can be located within a temperature-controlled area such as a cryostat (not shown). In various aspects, an ambient temperature of the qubit 106 can thus be well controlled (e.g., consistently kept at low and/or cryogenic temperatures to optimize superconducting behavior of the qubit 106). In some cases, an ambient temperature of the RTE 104 can be less well controlled (e.g., can be kept at room temperature, which can fluctuate over time within a defined margin of variability). As mentioned above, fluctuations and/or variations in the ambient temperature of the RTE 104 can cause corresponding fluctuations and/or variations in the power output of the RTE 104, which can in turn cause corresponding fluctuations and/or variations in the power levels (e.g., in the amplitudes and/or phases) of the plurality of microwave pulses 1 to N. When the power levels (e.g., amplitudes and/or phases) of the plurality of microwave pulses 1 to N fluctuate and/or vary, improper, incomplete, and/or undesired state rotations can be imparted on the qubit 106 rather than proper, complete, and/or desired state rotations. This can negatively affect the performance of the qubit 106. Accordingly, calibration of the plurality of microwave pulses 1 to N can be required. In various instances, the canary parameter calibration system 102 can facilitate calibration of the plurality of microwave pulses 1 to N in less time than can calibration techniques that monitor and/or measure every microwave pulse independently.

In various embodiments, the canary parameter calibration system 102 can be communicatively coupled to the RTE 104 and/or to the qubit 106 via any suitable wired and/or wireless electronic connection for use in quantum computing systems.

In various embodiments, the canary parameter calibration system 102 can comprise a processor 110 (e.g., computer processing unit, microprocessor) and a computer-readable memory 112 that is operably connected to the processor 110. The memory 112 can store computer-executable instructions which, upon execution by the processor 110, can cause the processor 110 and/or other components of the canary parameter calibration system 102 (e.g., measurement component 114, scaling component 116) to perform one or more acts. In various embodiments, the memory 112 can store computer-executable components (e.g., measurement component 114, scaling component 116), and the processor 110 can execute the computer-executable components.

In various embodiments, the canary parameter calibration system 102 can comprise a measurement component 114. In various aspects, the measurement component 114 can measure (e.g., via an error amplifying sequence) a rotation error of the qubit 106 when the qubit 106 is driven by one of the plurality of microwave pulses 1 to N. In various instances, the rotation error of the qubit 106 can be a difference and/or distance between an actual state rotation exhibited by the qubit 106 in response to being driven by the one of the plurality of microwave pulses 1 to N and a desired, intended, and/or goal state rotation which the qubit 106 would have exhibited if the power level of the one of the plurality of microwave pulses 1 to N were properly calibrated. Based on this rotation error, the measurement component can determine, calculate, estimate, and/or infer an actual power level of the one of the plurality of microwave pulses 1 to N (e.g., can determine, calculate, estimate, and/or infer a power deviation of the one of the plurality of microwave pulses 1 to N caused by a fluctuation in the ambient temperature of the RTE 104).

In this way, the qubit 106 can, in various aspects, be considered as functioning as a power meter and/or a power sensor. That is, the state rotation of the qubit 106 can be a function of the power level of the one of the plurality of microwave pulses 1 to N that is driving the qubit 106. By measuring the actual state rotation of the qubit 106 and by comparing that actual state rotation to a desired, intended, and/or goal state rotation that the qubit 106 would have undergone if the power level of the one of the plurality of microwave pulses 1 to N were properly calibrated, the actual power level of the one of the plurality of microwave pulses 1 to N can be derived, calculated, estimated, and/or approximated (e.g., via any suitable mathematical, statistical, and/or computational technique in the field of quantum computing).

In various embodiments, the canary parameter calibration system 102 can comprise a scaling component 116. In various aspects, the scaling component 116 can generate a scaling factor based on the rotation error measured by the measurement component 114. In various cases, the scaling factor can be a ratio, proportion, percentage, and/or multiplier which can be applied to the actual power level of the one of the plurality of microwave pulses 1 to N in order to correct and/or calibrate the power level of the one of the plurality of microwave pulses 1 to N. In some cases, the scaling factor can be a reciprocal of the power deviation determined by the measurement component 114. For example, if the measurement component 114 determines that the actual power level of the one of the plurality of microwave pulses 1 to N is ⅘ the amount of the desired, intended, and/or goal power level, the scaling component 116 can generate a scaling factor of 5/4 (e.g., since 5/4 of the actual power level of the one of the plurality of microwave pulses 1 to N can be equal to the desired, intended, and/or goal power level of the one of the plurality of microwave pulses 1 to N).

In various instances, the scaling component 116 can apply the scaling factor to not only the one of the plurality of microwave pulses 1 to N, but also to the rest of the plurality of microwave pulses 1 to N. The scaling component 116 can, in various cases, instruct the RTE 104 to increase and/or decrease the power levels of all the plurality of microwave pulses 1 to N by the scaling factor. In various cases, the RTE 104 can adjust, control, and/or modulate the amplitudes and/or the phases of the plurality of microwave pulses 1 to N in order to comply with the scaling factor (e.g., in order to increase and/or decrease the power levels in accordance with the scaling factor). Those of ordinary skill in the art will appreciate how the amplitude and/or phase of a microwave pulse can modulated and/or controlled in order to correspondingly modulate and/or control the power level of the microwave pulse.

In this way, the canary parameter calibration system 102 can facilitate calibration of all of the plurality of microwave pulses 1 to N without having to measure and/or monitor every one of the plurality of microwave pulses 1 to N individually and/or independently. Instead, a single microwave pulse can be monitored to determine a power deviation caused by ambient conditions, all (in some cases, fewer than all) of the plurality of microwave pulses 1 to N can be assumed and/or inferred to suffer from the same power deviation, and all (in some cases, fewer than all) of the plurality of microwave pulses 1 to N can be calibrated in one swoop based on the power deviation. Specifically, the rotation error associated with the single microwave pulse can be measured by the measurement component, a scaling factor based on the rotation error can be generated by the scaling component to rectify and/or minimize the rotation error, and the power levels of the plurality of microwave pulses 1 to N can be modulated and/or controlled according to the scaling factor in order to counteract, cancel, and/or negate the power deviations caused by the ambient temperature of the RTE 104. Since the ambient temperature can affect the RTE 104, and since the RTE 104 can generate the plurality of microwave pulses 1 to N, the plurality of microwave pulses 1 to N can, in various cases, be inferred and/or assumed to be similarly affected by the ambient temperature of the RTE 104 (e.g., the power levels of the plurality of microwave pulses 1 to N can be inferred and/or assumed to increase and/or decrease by the same and/or similar proportions in response to the ambient temperature of the RTE 104).

In some cases, the canary parameter calibration system 102 can iteratively calibrate the power levels of the plurality of microwave pulses 1 to N (e.g., at regular/periodic intervals, at irregular/aperiodic intervals). In some cases, such iteration can be performed until the rotation error measured by the measurement component 114 is below a predetermined threshold (e.g., until the actual state rotation of the qubit 106 is within a suitable threshold value of the desired, intended, and/or goal state rotation).

In various embodiments, although FIG. 1 depicts only a single qubit 106 as being coupled to the RTE 104, this is non-limiting and exemplary only. In various aspects, any suitable number of qubits can be coupled to the RTE 104, with every one of those qubits coupled to the RTE 104 by its own corresponding qubit control channel. In some cases, calibration can be performed by simply monitoring the rotation error of one microwave pulse per qubit (e.g., such that each qubit and/or each qubit control channel can have its own corresponding scaling factor).

Figure 2:
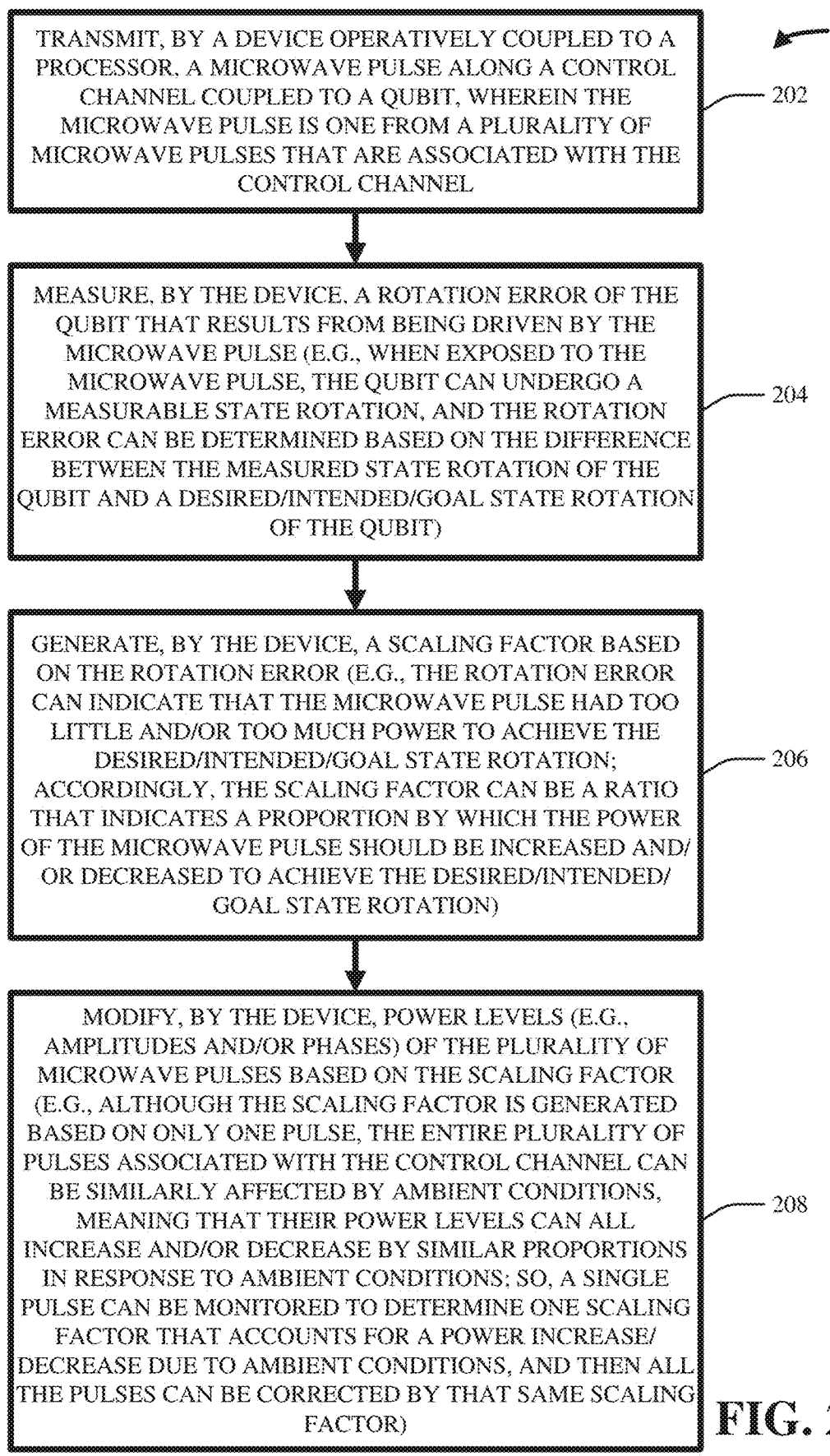
FIG. 2 illustrates a flow diagram of an example, non-limiting computer-implemented method that facilitates qubit pulse calibration via canary parameter monitoring in accordance with one or more embodiments described herein.

FIG. 2 illustrates a flow diagram of an example, non-limiting computer-implemented method 200 that can facilitate qubit pulse calibration via canary parameter monitoring in accordance with one or more embodiments described herein. In some cases, the computer-implemented method 200 can be facilitated by the system 100.

In various embodiments, act 202 can include transmitting, by a device operatively coupled to a processor (e.g., RTE 104), a microwave pulse (e.g., one of the plurality of microwave pulses 1 to N) along a control channel (e.g., the qubit control channel 108) coupled to a qubit (e.g., the qubit 106). In some cases, the microwave pulse can be one from a plurality of microwave pulses that are associated with the control channel (e.g., the plurality of microwave pulses 1 to N).

In various instances, act 204 can include measuring, by the device (e.g., the measurement component 114), a rotation error of the qubit that results from being driven by the microwave pulse. For instance, when exposed to the microwave pulse, the qubit can undergo a measurable state rotation. In some cases, the rotation error can be determined based on the difference between the measured state rotation of the qubit and a desired, intended, and/or goal state rotation of the qubit.

In various aspects, act 206 can include generating, by the device (e.g., the scaling component 116), a scaling factor based on the rotation error. For instance, the rotation error can indicate that the microwave pulse had too little and/or too much power to achieve the desired, intended, and/or goal state rotation. Accordingly, the scaling factor can, in some cases, be a ratio (e.g., proportion, percentage, multiplier) that indicates a proportion by which the power of the microwave pulse should be increased and/or decreased in order to achieve the desired, intended, and/or goal state rotation.

In various embodiments, act 208 can include modifying, by the device (e.g., the scaling component 116 and/or the RTE 104) power levels of the plurality of microwave pulses based on the scaling factor. In some cases, the power levels can be modulated by modulating and/or controlling the amplitudes and/or phases of the plurality of microwave pulses. In some cases, although the scaling factor can be generated based on only the one microwave pulse in the plurality of microwave pulses, the entire plurality of microwave pulses can be similarly affected by ambient conditions (e.g., ambient temperature of the RTE 104). So, in various cases, a single pulse can be monitored to determine one scaling factor that accounts for and/or corrects a power increase/decrease caused by ambient conditions, and all of the pulses can be corrected and/or modified by that same scaling factor. In this way, the rotation error of the one pulse that is monitored can be considered as a canary parameter that captures not only its own behavior and/or variability, but also the behavior and/or variability of the rotation errors of the rest of the plurality of pulses that can be fed to the qubit. Qubit pulse calibration based on canary parameter monitoring can, in various embodiments, require much less time to perform than can full monitoring and/or calibration of each pulse individually, while providing comparable and/or better calibration results.

Figure 3:
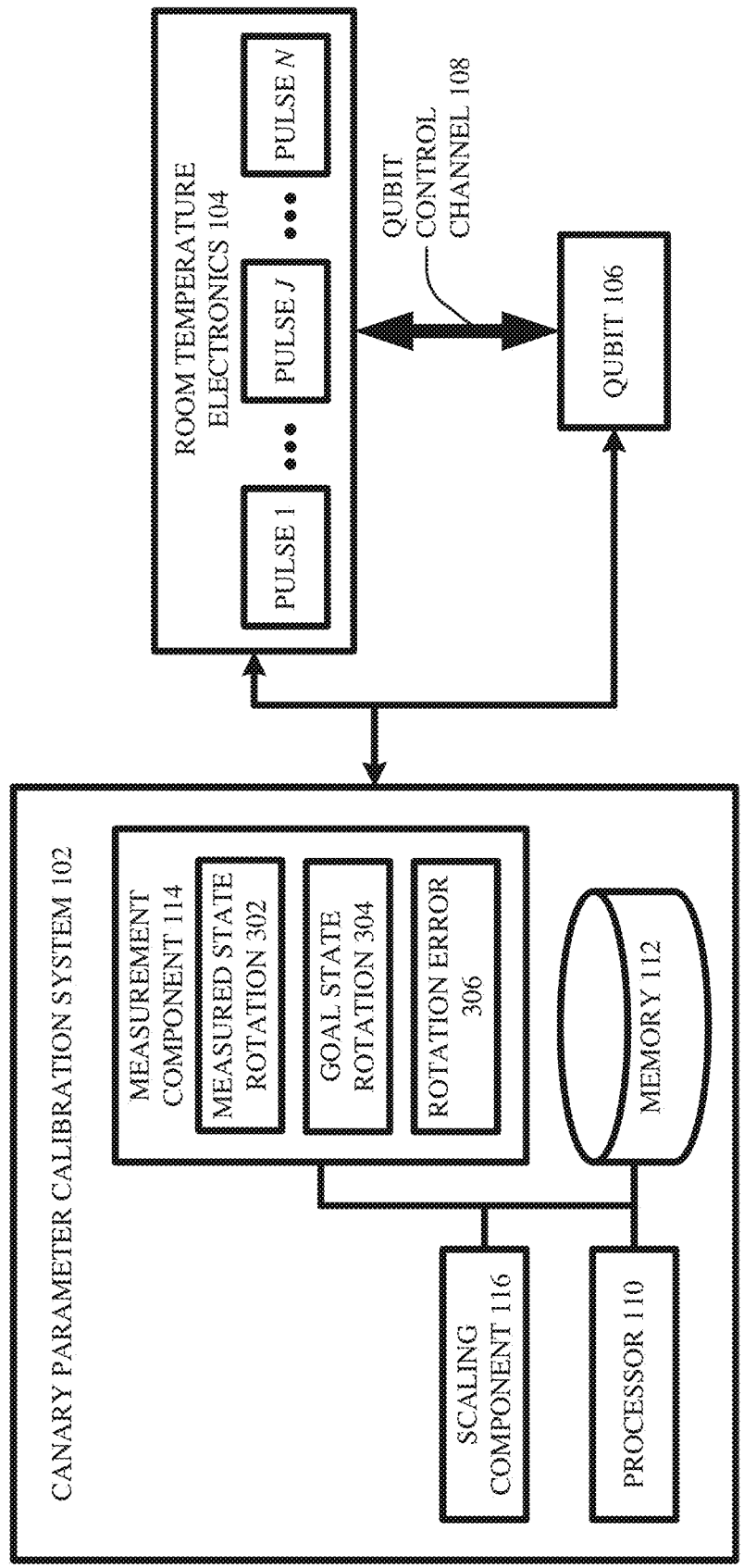
FIG. 3 illustrates a block diagram of an example, non-limiting system including a rotation error that facilitates qubit pulse calibration via canary parameter monitoring in accordance with one or more embodiments described herein.

FIG. 3 illustrates a block diagram of an example, non-limiting system 300 including a rotation error that can facilitate qubit pulse calibration via canary parameter monitoring in accordance with one or more embodiments described herein. In various aspects, the system 300 can comprise the same components as the system 100, and can further comprise a measured state rotation 302, a goal state rotation 304, and/or a rotation error 306.

In various embodiments, the RTE 104 can generate a microwave pulse J, where J can be any suitable number from 1 to N, inclusively. In various aspects, the microwave pulse J can be transmitted along the qubit control channel 108 to the qubit 106. In various cases, upon being exposed to the microwave pulse J, the qubit 106 can experience a state rotation (e.g., a quantum gate can be applied to the qubit 106, with the identity of the quantum gate corresponding to the actual power level (e.g., to the amplitude and/or phase) of the microwave pulse J).

In various aspects, the measurement component 114 can measure (e.g., via any suitable quantum state measuring apparatus and/or technique) the state rotation of the qubit 106, thereby yielding the measured state rotation 302. In various cases, the measured state rotation 302 can be the actual state rotation which qubit 106 undergoes when driven by the microwave pulse J.

In various aspects, the measurement component 114 can determine and/or know the goal state rotation 304. In various cases, the goal state rotation 304 can be a desired and/or intended state rotation that the qubit 106 is supposed to experience when exposed to and/or driven by the microwave pulse J (e.g., when the power level (e.g., amplitude and/or phase) of the microwave pulse J is properly calibrated). In other words, the goal state rotation 304 can be a state rotation which the qubit 106 would undergo if the microwave pulse J were to apply a desired and/or intended quantum gate to the qubit 106. As explained above, the power level of the microwave pulse J can be influenced by the ambient temperature of the RTE 104. Thus, increases and/or decreases in the ambient temperature of the RTE 104 can correspondingly increase and/or decrease the power level of the microwave pulse J. The result can be that the microwave pulse J applies a quantum gate to the qubit 106 that is not the intended and/or desired quantum gate. In various instances, the measurement component 114 can compare the measured state rotation 302 to the goal state rotation 304 to generate the rotation error 306 (e.g., the difference and/or distance between the measured state rotation 302 and the goal state rotation 304). In various embodiments, the measurement component 114 can determine an actual power level of the microwave pulse J based on the rotation error 306 (e.g., the desired power level to achieve the goal state rotation 304 can be known, and the measured state rotation 302 can be known; based on this information, the actual power level of the microwave pulse J that caused the measured state rotation 302 can be derived via any suitable mathematical, statistical, and/or computational technique).

Figure 4:
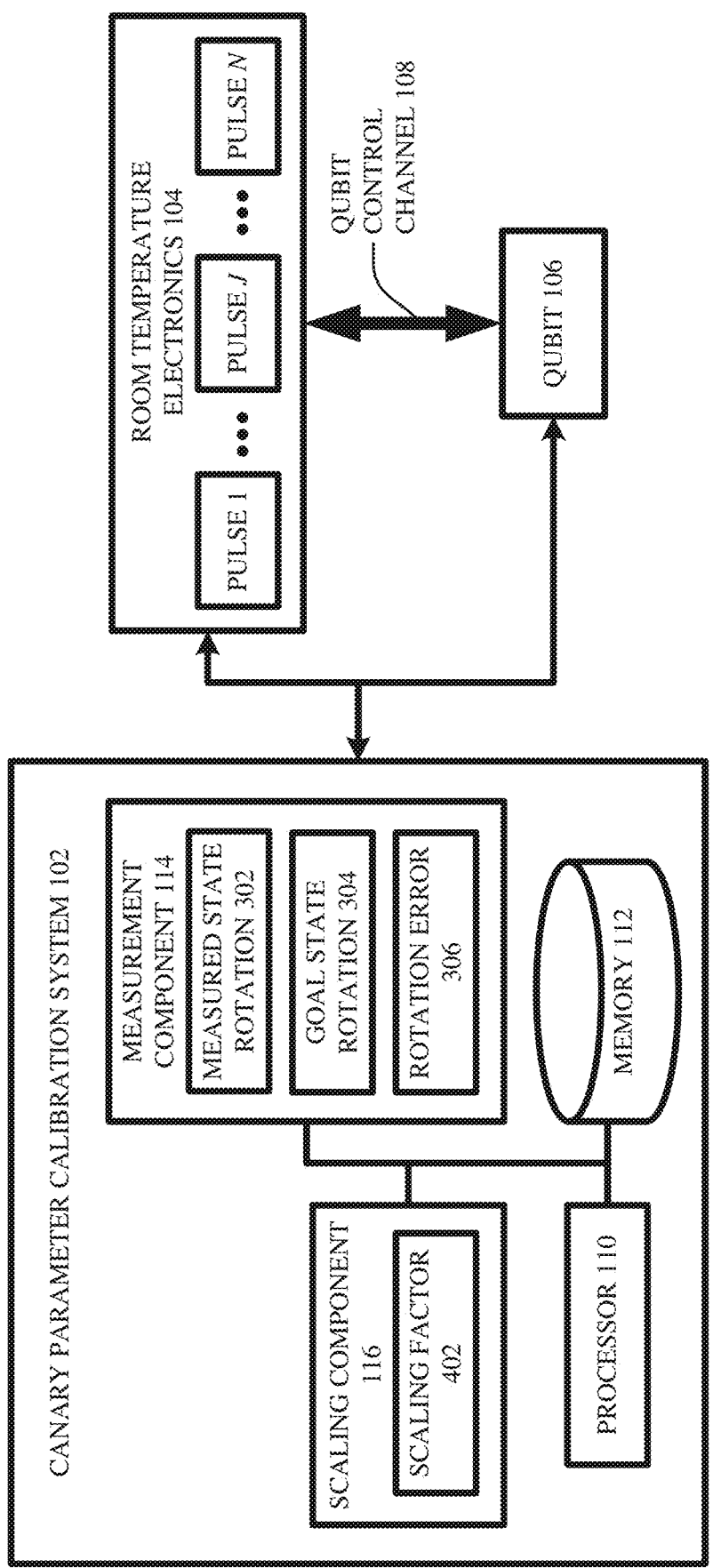
FIG. 4 illustrates a block diagram of an example, non-limiting system including a scaling factor that facilitates qubit pulse calibration via canary parameter monitoring in accordance with one or more embodiments described herein.

FIG. 4 illustrates a block diagram of an example, non-limiting system 400 including a scaling factor that can facilitate qubit pulse calibration via canary parameter monitoring in accordance with one or more embodiments described herein. In various cases, the system 400 can comprise the same components as the system 300, and can further comprise a scaling factor 402.

In various embodiments, the scaling component 116 can generate the scaling factor 402 based on the rotation error 306. As mentioned above, the rotation error 306 can, in various aspects, be used to determine and/or derive the actual power level of the microwave pulse J (e.g., the power level of the microwave pulse J as influenced and/or affected by the ambient temperature of the RTE 104). In various instances, the scaling component 116 can determine a multiplier, ratio, proportion, and/or percentage which, when applied to the actual power level of the microwave pulse J, would shift and/or convert the actual power level of the microwave pulse J to the desired, intended, and/or goal power level of the microwave pulse J (e.g., that would change the actual power level to the power level required to achieve the goal state rotation 304). In some cases, this multiplier, ratio, proportion, and/or percentage can be the scaling factor 402. In various aspects, the scaling factor 402 can be a reciprocal of a power deviation of the microwave pulse J. For example, if the rotation error 306 indicates that the actual power level of the microwave pulse J is ⅔ of its desired, intended, and/or goal value, then the scaling factor 402 can be 3/2, which is the reciprocal of ⅔. This can be the case because, in such example, 3/2 of the actual power value of the microwave pulse J would equal the desired, intended, and/or goal power value of the microwave pulse J.

In various embodiments, the scaling component 116 can apply the scaling factor 402 to all (and/or any suitable subset) of the plurality of microwave pulses 1 to N (e.g., to all and/or any suitable subset of the microwave pulses which can be fed to the qubit 106). In other words, the scaling component 116 can modify the power levels of the plurality of microwave pulses 1 to N in accordance with the scaling factor. This can, in various instances, counteract, cancel, and/or negate power deviations experienced by the plurality of microwave pulses 1 to N due to the ambient temperature of the RTE 104. In some cases, the scaling component 116 can facilitate such modification by sending an electronic and/or digital instruction to the RTE 104, which instruction can command the RTE 104 to alter its program settings so as to multiply the power levels of the plurality of microwave pulses 1 to N by the scaling factor 402. As mentioned above, the RTE 104 can, in various instances, modulate and/or control the amplitudes and/or phases of the plurality of microwave pulses 1 to N in order to correspondingly modulate and/or control the power levels of the plurality of microwave pulses 1 to N. Again, those of ordinary skill in the art will understand how to control amplitude and/or phase in order to correspondingly control power level. When the program settings of the RTE 104 are adjusted according to the scaling factor 402 (e.g., are adjusted to modulate the power levels of the plurality of microwave pulses 1 to N according to the scaling factor 402), the power deviations experienced by the plurality of microwave pulses 1 to N can be negated, cancelled, and/or counteracted (e.g., if the ambient temperature of the RTE 104 causes the power levels of the plurality of microwave pulses 1 to N to be reduced by a factor of ⅔ (to be reduced by ⅓ or 33%), then increasing the power levels of the plurality of microwave pulses 1 to N by a factor of 3/2 (to be increased by ½ or 50%) can calibrate the plurality of microwave pulses 1 to N back to their desired, intended, and/or goal power levels). In this way, calibration of the plurality of microwave pulses 1 to N can be facilitated by monitoring only the one microwave pulse J. This can save time and/or resources as compared to monitoring each of the plurality of microwave pulses 1 to N independently.

In some embodiments, the measurement component 114 and/or the scaling component 116 can employ any suitable machine learning and/or artificial intelligence techniques for facilitating and/or performing their functionalities. To facilitate the above-described machine learning aspects of various embodiments of the invention, consider the following discussion of artificial intelligence. Various embodiments of the invention herein can employ artificial intelligence (AI) to facilitate automating one or more features of embodiments of the invention. The components can employ various AI-based schemes for carrying out various embodiments/examples disclosed herein. In order to provide for or aid in the numerous determinations (e.g., determine, ascertain, infer, calculate, predict, prognose, estimate, derive, forecast, detect, compute) of embodiments of the invention, components of embodiments of the invention can examine the entirety or a subset of the data to which it is granted access and can provide for reasoning about or determine states of the system and/or environment from a set of observations as captured via events and/or data. Determinations can be employed to identify a specific context or action, or can generate a probability distribution over states, for example. The determinations can be probabilistic; that is, the computation of a probability distribution over states of interest based on a consideration of data and events. Determinations can also refer to techniques employed for composing higher-level events from a set of events and/or data.

Such determinations can result in the construction of new events or actions from a set of observed events and/or stored event data, whether or not the events are correlated in close temporal proximity, and whether the events and data come from one or several event and data sources. Components disclosed herein can employ various classification (explicitly trained (e.g., via training data) as well as implicitly trained (e.g., via observing behavior, preferences, historical information, receiving extrinsic information)) schemes and/or systems (e.g., support vector machines, neural networks, expert systems, Bayesian belief networks, fuzzy logic, data fusion engines) in connection with performing automatic and/or determined action in connection with the claimed subject matter. Thus, classification schemes and/or systems can be used to automatically learn and perform a number of functions, actions, and/or determinations.

A classifier can map an input attribute vector, z=(z1, z2, z3, z4, zn), to a confidence that the input belongs to a class, as by f(z)=confidence(class). Such classification can employ a probabilistic and/or statistical-based analysis (e.g., factoring into the analysis utilities and costs) to determinate an action to be automatically performed. A support vector machine (SVM) can be an example of a classifier that can be employed. The SVM operates by finding a hyper-surface in the space of possible inputs, where the hyper-surface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and/or probabilistic classification models providing different patterns of independence, any of which can be employed. Classification as used herein also is inclusive of statistical regression that is utilized to develop models of priority.

Figure 5:
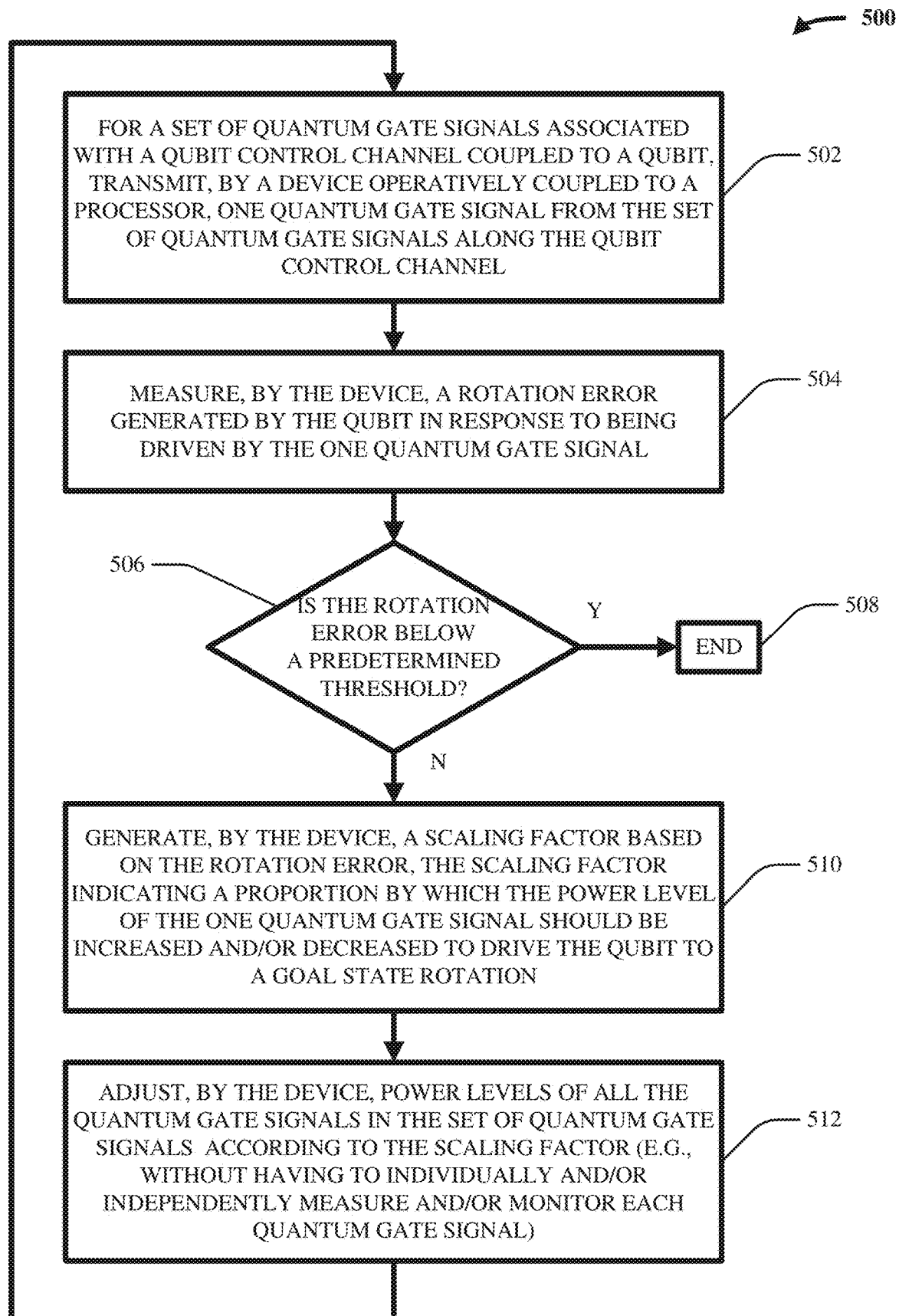
FIG. 5 illustrates a flow diagram of an example, non-limiting computer-implemented method that facilitates iterative qubit pulse calibration via canary parameter monitoring in accordance with one or more embodiments described herein.

FIG. 5 illustrates a flow diagram of an example, non-limiting computer-implemented method 500 that can facilitate iterative qubit pulse calibration via canary parameter monitoring in accordance with one or more embodiments described herein. In various aspects, the computer-implemented method 500 can be facilitated by the system 400.

In various embodiments, act 502 can include, for a set of quantum gate signals (e.g., the plurality of microwave pulses 1 to N) associated with a qubit control channel (e.g., the qubit control channel 108) coupled to a qubit (e.g., the qubit 106), transmitting, by a device operatively coupled to a processor (e.g., the RTE 104), one quantum gate signal (e.g., the microwave pulse J) from the set of quantum gate signals along the qubit control channel.

In various instances, act 504 can include measuring, by the device (e.g., the measurement component 114), a rotation error (e.g., the rotation error 306) generated by the qubit in response to being driven by the one quantum gate signal.

In various aspects, act 506 can include determining, by the device (e.g., the measurement component 114), whether the rotation error is below a predetermined threshold (e.g., any suitable threshold margin of error). If yes, the computer-implemented method 500 can proceed to act 508 and end (e.g., since the rotation error is below the predetermined threshold, the actual power level of the one quantum gate signal is deemed to be close enough to the desired, intended, and/or goal power level, and the actual power levels of the rest of the set of quantum gate signals are assumed and/or inferred to likewise be close enough to their desired, intended, and/or goal power levels). If no, the computer-implemented method 500 can proceed to act 510.

In various cases, act 510 can include generating, by the device (e.g., the scaling component 116), a scaling factor (e.g., the scaling factor 402) based on the rotation error. In various instances, the scaling factor can indicate a proportion by which the power level of the one quantum gate signal should be increased and/or decreased to drive the qubit to a goal state rotation.

In various embodiments, act 512 can include adjusting, by the device (e.g., the scaling component 116 and/or the RTE 104), power levels of all the quantum gate signals in the set of quantum gate signals according to the scaling factor. In various instances, calibration of the entire set of quantum gate signals can thus be facilitated without having to individually and/or independently measure and/or monitor each quantum gate signal. Instead, monitoring of merely one quantum gate signal (e.g., a canary parameter) can suffice. As explained above, this can be due to the fact that the entire set of quantum gate signals can be similarly affected by ambient temperatures (e.g., the power levels of all the quantum gate signals in the set of quantum gate signals can increase and/or decrease by similar proportions due to ambient conditions, and so a single scaling factor is all that is needed, rather than a separate scaling factor for each quantum gate signal).

As shown, the computer-implemented method 500 can proceed from act 512 back to act 502, act 504, and act 506. This iterative process (e.g., 502 to 504 to 506 to 510 to 512 to 502) can continue to loop until the rotation error (e.g., the canary parameter) is below the predetermined threshold (e.g., until the actual power levels are deemed to be close enough to their desired, intended, and/or goal values).

Figure 6:
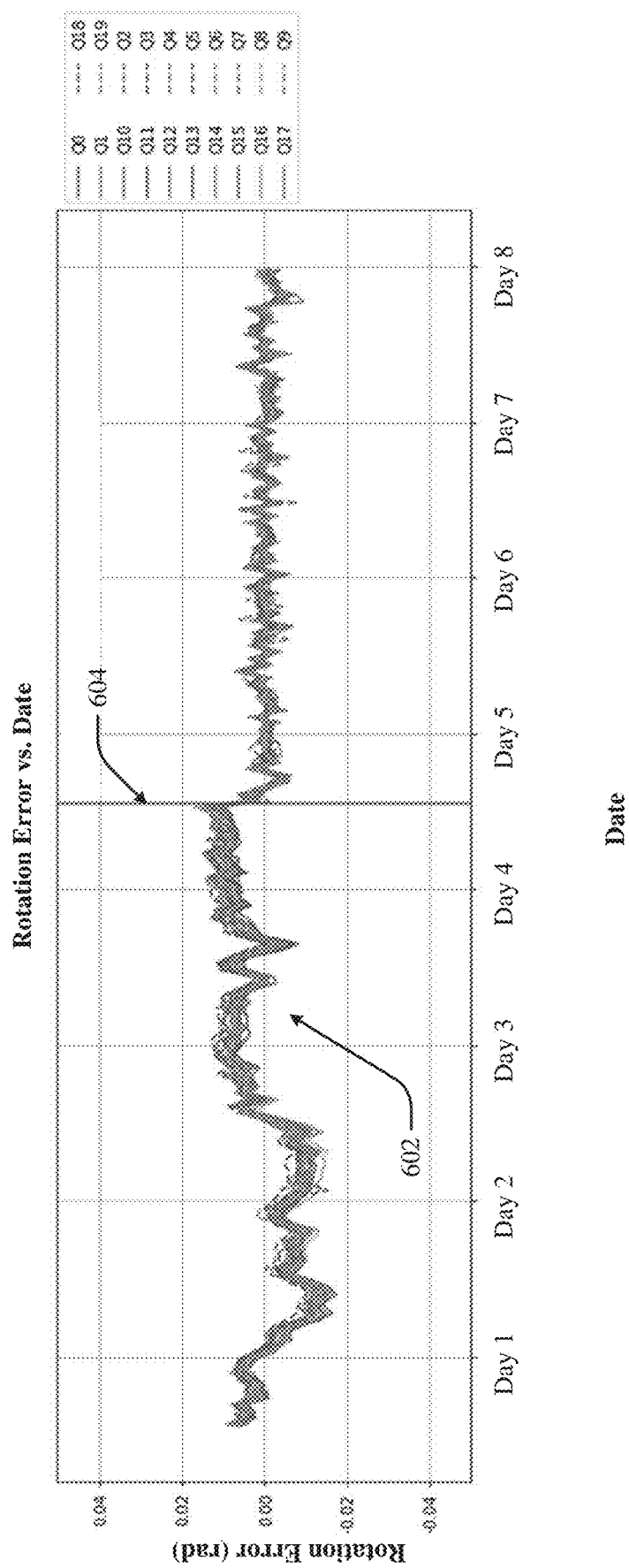
FIG. 6 illustrate a graph of example, non-limiting experimentation results associated with qubit pulse calibration via canary parameter monitoring in accordance with one or more embodiments described herein.

FIG. 6 illustrate a graph 600 of example, non-limiting experimentation results associated with qubit pulse calibration via canary parameter monitoring in accordance with one or more embodiments described herein.

As shown, the graph 600 illustrates the rotation errors 602 of twenty different qubits in a quantum computing system. As shown, the rotation errors 602 are plotted against date and/or time of calibration. In various aspects, embodiments of the invention were implemented after the date/time 604 and not before the date/time 604. As shown, the rotation errors 602 ranged between ±0.02 before the date/time 604. However, after the date/time 604, the magnitude of the rotation errors 602 decreased to between ±0.005. In other words, embodiments of the invention were able to significantly decrease the absolute values of the rotation errors 602. In various aspects, this is because various embodiments of the invention can perform qubit pulse calibration very quickly compared to calibration techniques in which each pulse of each qubit is monitored and/or calibrated independently (e.g., less time can be expended when only one canary parameter is monitored per qubit). Because various embodiments of the invention can save significant amounts of time, calibrations on the qubits can be performed more frequently, which can help to keep the rotation errors 602 closer to zero. This can explain why the rotation errors 602 get significantly closer to zero after the date/time 604.

Figure 7:
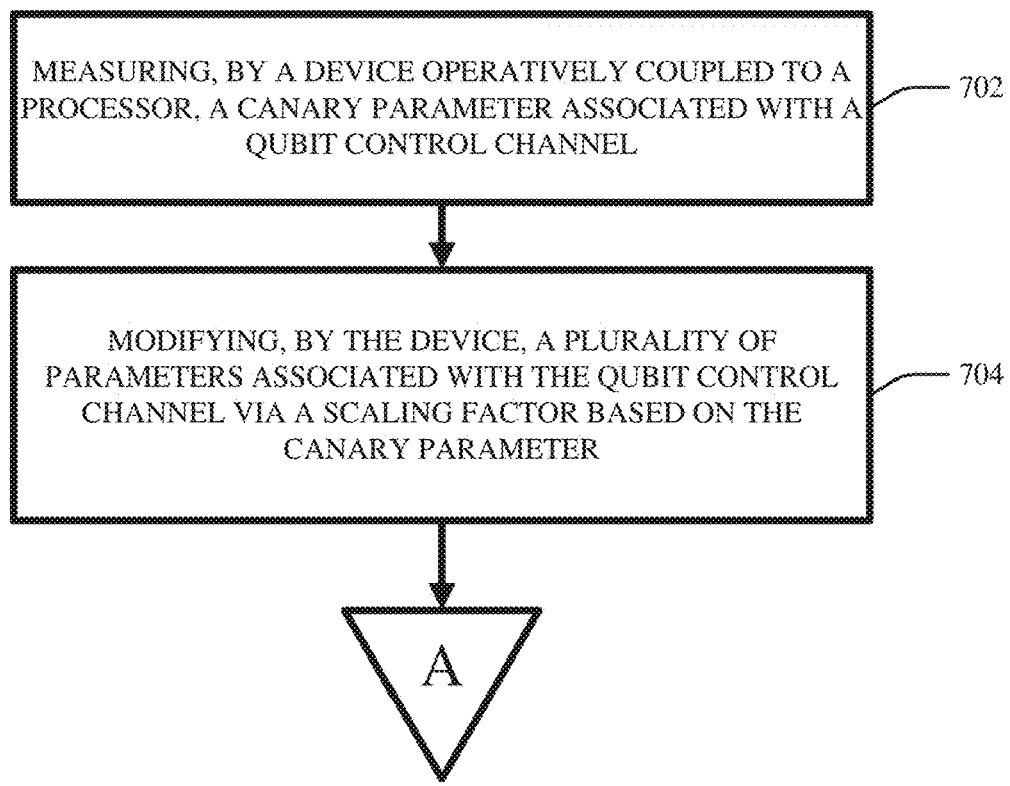
FIG. 7 illustrates a flow diagram of an example, non-limiting computer-implemented method that facilitates qubit pulse calibration via canary parameter monitoring in accordance with one or more embodiments described herein.

FIG. 7 illustrates a flow diagram of an example, non-limiting computer-implemented method 700 that can facilitate qubit pulse calibration via canary parameter monitoring in accordance with one or more embodiments described herein.

In various embodiments, act 702 can include measuring, by a device operatively coupled to a processor (e.g., 114), a canary parameter (e.g., 306) associated with a qubit control channel (e.g., 108).

In various instances, act 704 can include modifying, by the device (e.g., 116 and/or 104), a plurality of parameters (e.g., the plurality of microwave pulses 1 to N) associated with the qubit control channel via a scaling factor (e.g., 402) based on the canary parameter.

Figure 8:
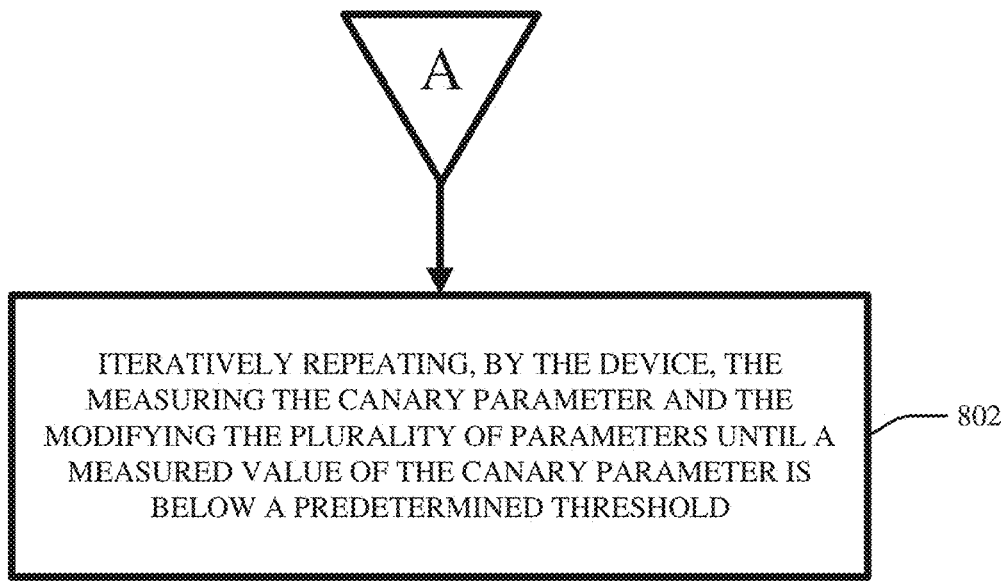
FIG. 8 illustrates a flow diagram of an example, non-limiting computer-implemented method including iteration that facilitates qubit pulse calibration via canary parameter monitoring in accordance with one or more embodiments described herein.

FIG. 8 illustrates a flow diagram of an example, non-limiting computer-implemented method 800 including iteration that can facilitate qubit pulse calibration via canary parameter monitoring in accordance with one or more embodiments described herein. In various aspects, the computer-implemented method 800 can comprise the same acts as the computer-implemented method 700, and can further comprise act 802.

In various embodiments, act 802 can include iteratively repeating, by the device (e.g., 114, 116, and/or 104), the measuring the canary parameter and the modifying the plurality of parameters until a measured value of the canary parameter is below a predetermined threshold.

Figure 9:
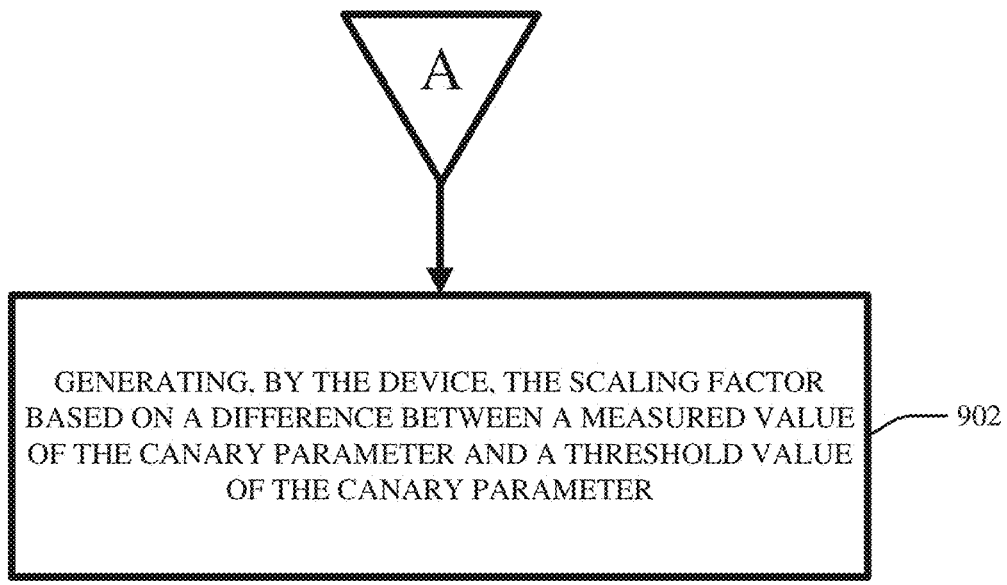
FIG. 9 illustrates a flow diagram of an example, non-limiting computer-implemented method including generating a scaling factor that facilitates qubit pulse calibration via canary parameter monitoring in accordance with one or more embodiments described herein.

FIG. 9 illustrates a flow diagram of an example, non-limiting computer-implemented method 900 including generating a scaling factor that can facilitate qubit pulse calibration via canary parameter monitoring in accordance with one or more embodiments described herein. In various aspects, the computer-implemented method 900 can comprise the same acts as the computer-implemented method 700, and can further comprise act 902.

In various embodiments, act 902 can include generating, by the device (e.g., 116), the scaling factor based on a difference between a measured value of the canary parameter (e.g., 302) and a threshold value of the canary parameter (e.g., 304).

As explained herein, various embodiments of the invention can utilize the fact that the primary mechanism affecting the variation of calibrated amplitudes and/or phases of qubit control microwave pulses is variation of the channel power of the room temperature electronics. By monitoring a single sensitive parameter of one pulse per qubit, it is possible to infer and correct for the channel power variation of all pulses originating on that physical channel without actually monitoring the rest of the pulses that use that physical channel. Because the channel power calibration based on a canary parameter as described herein can be very fact and/or less time-consuming as compared to monitoring/calibration of all the pulses individually, it can be possible to more frequently perform the calibration without significantly reducing the throughput of the quantum computing system. This can provide a feedback mechanism to more quickly prevent error that would occur due to drift in the room temperature electronics.

Figure 10:
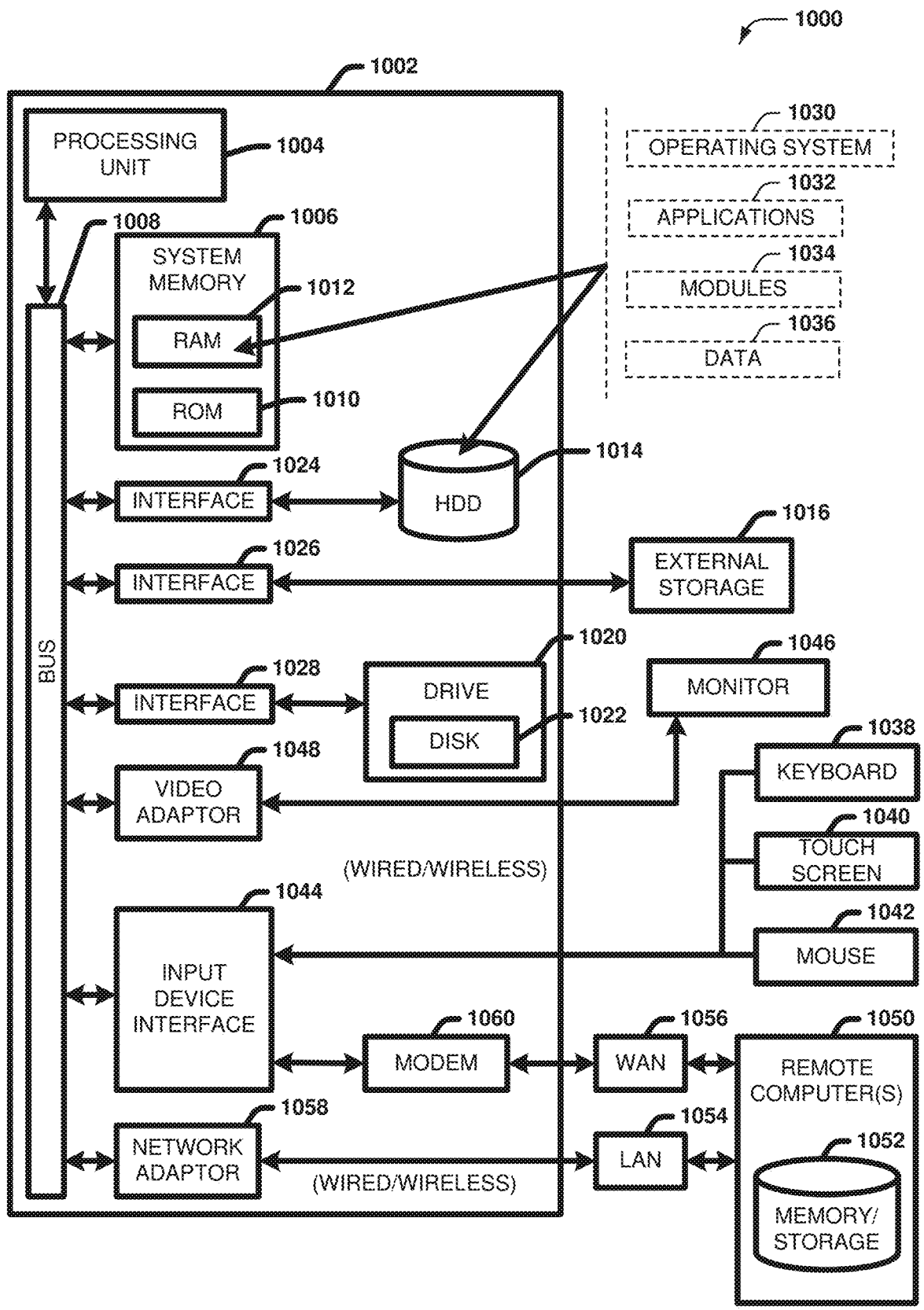
FIG. 10 illustrates a block diagram of an example, non-limiting operating environment in which one or more embodiments described herein can be facilitated.

In order to provide additional context for various embodiments described herein, FIG. 10 and the following discussion are intended to provide a general description of a suitable computing environment 1000 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014 (e.g., EIDE, SATA), one or more external storage devices 1016 (e.g., a magnetic floppy disk drive (FDD) 1016, a memory stick or flash drive reader, a memory card reader, etc.) and a drive 1020, e.g., such as a solid state drive, an optical disk drive, which can read or write from a disk 1022, such as a CD-ROM disc, a DVD, a BD, etc. Alternatively, where a solid state drive is involved, disk 1022 would not be included, unless separate. While the internal HDD 1014 is illustrated as located within the computer 1002, the internal HDD 1014 can also be configured for external use in a suitable chassis (not shown). Additionally, while not shown in environment 1000, a solid state drive (SSD) could be used in addition to, or in place of, an HDD 1014. The HDD 1014, external storage device(s) 1016 and drive 1020 can be connected to the system bus 1008 by an HDD interface 1024, an external storage interface 1026 and a drive interface 1028, respectively. The interface 1024 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can be enable with a security module, such as a trusted processing module (TPM). For instance with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network (LAN) 1054 and/or larger networks, e.g., a wide area network (WAN) 1056. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point (AP) disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the Internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above, such as but not limited to a network virtual machine providing one or more aspects of storage or processing of information. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 11:
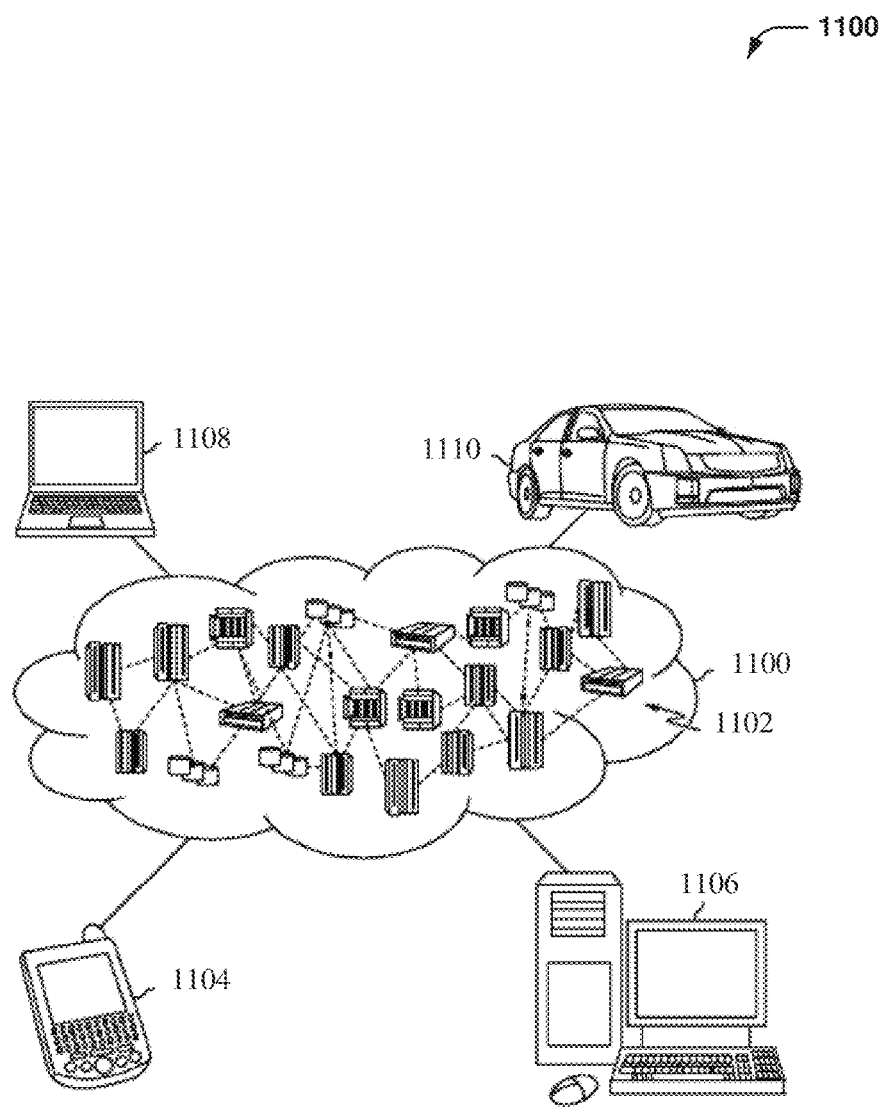
FIG. 11 illustrates an example, non-limiting cloud computing environment in accordance with one or more embodiments described herein.

Referring now to FIG. 11, illustrative cloud computing environment 1100 is depicted. As shown, cloud computing environment 1100 includes one or more cloud computing nodes 1102 with which local computing devices used by cloud consumers, such as, for example, personal digital assistant (PDA) or cellular telephone 1104, desktop computer 1106, laptop computer 1108, and/or automobile computer system 1110 may communicate. Nodes 1102 may communicate with one another. They may be grouped (not shown) physically or virtually, in one or more networks, such as Private, Community, Public, or Hybrid clouds as described hereinabove, or a combination thereof. This allows cloud computing environment 1100 to offer infrastructure, platforms and/or software as services for which a cloud consumer does not need to maintain resources on a local computing device. It is understood that the types of computing devices 1104-1110 shown in FIG. 11 are intended to be illustrative only and that computing nodes 1102 and cloud computing environment 1100 can communicate with any type of computerized device over any type of network and/or network addressable connection (e.g., using a web browser).

Figure 12:
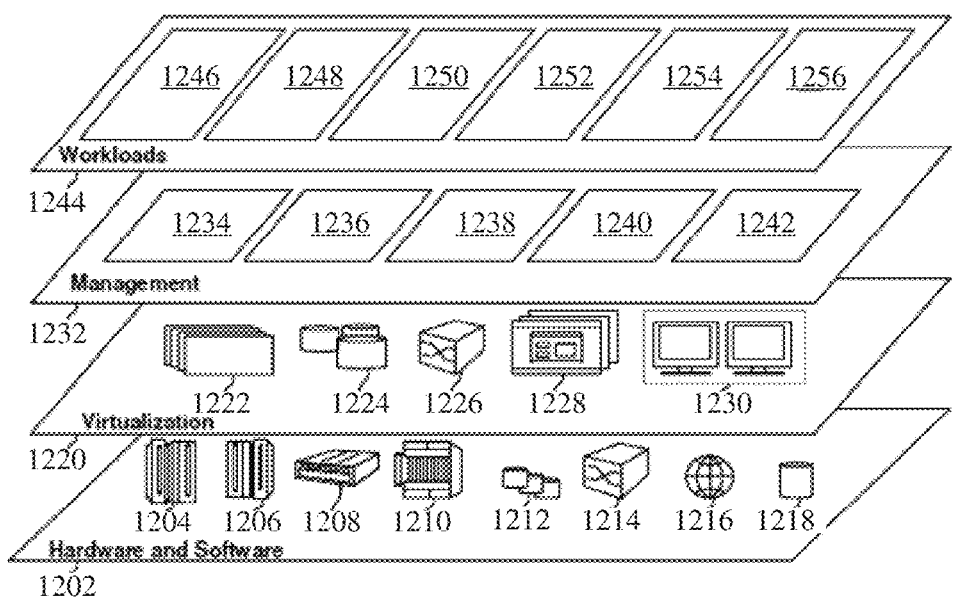
FIG. 12 illustrates example, non-limiting abstraction model layers in accordance with one or more embodiments described herein.

Referring now to FIG. 12, a set of functional abstraction layers provided by cloud computing environment 1100 (FIG. 11) is shown. Repetitive description of like elements employed in other embodiments described herein is omitted for sake of brevity. It should be understood in advance that the components, layers, and functions shown in FIG. 12 are intended to be illustrative only and embodiments of the invention are not limited thereto. As depicted, the following layers and corresponding functions are provided.

Hardware and software layer 1202 includes hardware and software components. Examples of hardware components include: mainframes 1204; RISC (Reduced Instruction Set Computer) architecture based servers 1206; servers 1208; blade servers 1210; storage devices 1212; and networks and networking components 1214. In some embodiments, software components include network application server software 1216 and database software 1218.

Virtualization layer 1220 provides an abstraction layer from which the following examples of virtual entities may be provided: virtual servers 1222; virtual storage 1224; virtual networks 1226, including virtual private networks; virtual applications and operating systems 1228; and virtual clients 1230.

In one example, management layer 1232 may provide the functions described below. Resource provisioning 1234 provides dynamic procurement of computing resources and other resources that are utilized to perform tasks within the cloud computing environment. Metering and Pricing 1236 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1238 provides access to the cloud computing environment for consumers and system administrators. Service level management 1240 provides cloud computing resource allocation and management such that required service levels are met. Service Level Agreement (SLA) planning and fulfillment 1242 provide pre-arrangement for, and procurement of, cloud computing resources for which a future requirement is anticipated in accordance with an SLA.

Workloads layer 1244 provides examples of functionality for which the cloud computing environment may be utilized. Examples of workloads and functions which may be provided from this layer include: mapping and navigation 1246; software development and lifecycle management 1248; virtual classroom education delivery 1250; data analytics processing 1252; transaction processing 1254; and differentially private federated learning processing 1256. Various embodiments of the present invention can utilize the cloud computing environment described with reference to FIGS. 11 and 12 to execute one or more differentially private federated learning process in accordance with various embodiments described herein.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a processor that executes computer-executable components stored in a memory, the computer-executable components comprising:
      a measurement component that measures a canary parameter associated with a qubit control channel; and
      a scaling component that modifies a plurality of parameters associated with the qubit control channel via a scaling factor based on the canary parameter.

2. The system of claim 1, wherein the measurement component iteratively measures the canary parameter and wherein the scaling component iteratively modifies the plurality of parameters until a measured value of the canary parameter is below a predetermined threshold.

3. The system of claim 1, wherein the scaling component generates the scaling factor based on a difference between a measured value of the canary parameter and a threshold value of the canary parameter.

4. The system of claim 1, wherein the canary parameter is a rotation error of a qubit driven by a microwave pulse transmitted along the qubit control channel.

5. The system of claim 4, wherein the plurality of parameters are amplitudes of a plurality of microwave pulses transmitted along the qubit control channel.

6. The system of claim 4, wherein the plurality of parameters are phases of a plurality of microwave pulses transmitted along the qubit control channel.

7. The system of claim 4, wherein the microwave pulse corresponds to a single-qubit gate.

8. The system of claim 4, wherein the microwave pulse corresponds to a cross-resonance gate.

9. A computer-implemented method, comprising:
   measuring, by a device operatively coupled to a processor, a canary parameter associated with a qubit control channel; and
   modifying, by the device, a plurality of parameters associated with the qubit control channel via a scaling factor based on the canary parameter.

10. The computer-implemented method of claim 9, further comprising:
    iteratively repeating, by the device, the measuring the canary parameter and the modifying the plurality of parameters until a measured value of the canary parameter is below a predetermined threshold.

11. The computer-implemented method of claim 9, further comprising:
    generating, by the device, the scaling factor based on a difference between a measured value of the canary parameter and a threshold value of the canary parameter.

12. The computer-implemented method of claim 9, wherein the canary parameter is a rotation error of a qubit driven by a microwave pulse transmitted along the qubit control channel.

13. The computer-implemented method of claim 12, wherein the plurality of parameters are amplitudes of a plurality of microwave pulses transmitted along the qubit control channel.

14. The computer-implemented method of claim 12, wherein the plurality of parameters are phases of a plurality of microwave pulses transmitted along the qubit control channel.

15. The computer-implemented method of claim 12, wherein the microwave pulse corresponds to a single-qubit gate.

16. The computer-implemented method of claim 12, wherein the microwave pulse corresponds to a cross-resonance gate.

17. A computer program product for facilitating qubit pulse calibration via canary parameter monitoring, the computer program product comprising a non-transitory computer readable memory having program instructions embodied therewith, the program instructions executable by a processor to cause the processor to:
    measure a canary parameter associated with a qubit control channel; and
    modify a plurality of parameters associated with the qubit control channel via a scaling factor based on the canary parameter.

18. The computer program product of claim 17, wherein the program instructions are further executable to cause the processor to:
    iteratively repeat the measuring the canary parameter and the modifying the plurality of parameters until a measured value of the canary parameter is below a predetermined threshold.

19. The computer program product of claim 17, wherein the program instructions are further executable to cause the processor to:
    generate the scaling factor based on a difference between a measured value of the canary parameter and a threshold value of the canary parameter.

20. The computer program product of claim 17, wherein the canary parameter is a rotation error of a qubit driven by a microwave pulse transmitted along the qubit control channel.

* * * * *